(12) United States Patent
Yamamoto

(10) Patent No.: US 11,133,148 B2
(45) Date of Patent: Sep. 28, 2021

(54) SCANNING ELECTRON MICROSCOPE

(71) Applicant: Hitachi High-Tech Corporation, Tokyo (JP)

(72) Inventor: Takuma Yamamoto, Tokyo (JP)

(73) Assignee: Hitachi High-Tech Corporation, Tokyo (JP)

( * ) Notice: Subject to any disclaimer, the term of this patent is extended or adjusted under 35 U.S.C. 154(b) by 0 days.

(21) Appl. No.: 16/398,921

(22) Filed: Apr. 30, 2019

(65) Prior Publication Data

US 2019/0362929 A1    Nov. 28, 2019

(30) Foreign Application Priority Data

May 22, 2018    (JP) .............................. JP2018-097543

(51) Int. Cl.
*H01J 37/21*    (2006.01)
*H01J 37/12*    (2006.01)
(Continued)

(52) U.S. Cl.
CPC .............. *H01J 37/21* (2013.01); *H01J 37/12* (2013.01); *H01J 37/244* (2013.01); *H01J 37/28* (2013.01);
(Continued)

(58) Field of Classification Search
CPC ... H01J 2237/04756; H01J 2237/24475; H01J 2237/2448; H01J 37/21; H01J 37/12; H01J 37/244; H01J 37/28
See application file for complete search history.

(56) References Cited

U.S. PATENT DOCUMENTS 6,538,249 B1 *    3/2003    Takane ...................... G06T 5/50
                                                                850/10
2005/0045821 A1 *    3/2005    Noji ........................ H01J 37/05
                                                                250/311
(Continued)

FOREIGN PATENT DOCUMENTS

JP         2002-334678 A        11/2002
JP         2010-211973 A         9/2010
(Continued)

OTHER PUBLICATIONS

Korean-language Office Action issued in Korean Application No. 10-2019-0012367 dated Mar. 17, 2020 with English translation (11 pages).

*Primary Examiner* — Sean M Luck
(74) *Attorney, Agent, or Firm* — Crowell & Moring LLP

(57) ABSTRACT

When a high-performance retarding voltage applying power supply cannot be employed in terms of costs or device miniaturization, it is difficult to sufficiently adjust focus in a high acceleration region within a range of changing an applied voltage, and identify a point at which a focus evaluation value is maximum. To address the above problems, the invention is directed to a scanning electron microscope including: an objective lens configured to converge an electron beam emitted from an electron source; a current source configured to supply an excitation current to the objective lens; a negative-voltage applying power supply configured to form a decelerating electric field of the electron beam on a sample; a detector configured to detect charged particles generated when the electron beam is emitted to the sample; and a control device configured to calculate a focus evaluation value from an image formed according to an output of the detector. The control device calculates a focus evaluation value when an applied voltage is changed, determines whether to increase or decrease an (Continued)

excitation current according to an increase or a decrease of the focus evaluation value, and supplies the excitation current based on a result of the determination.

9 Claims, 22 Drawing Sheets

(51) Int. Cl.
*H01J 37/28* (2006.01)
*H01J 37/244* (2006.01)

(52) U.S. Cl.
CPC .............. *H01J 2237/04756* (2013.01); *H01J 2237/2448* (2013.01); *H01J 2237/24475* (2013.01)

(56) References Cited

U.S. PATENT DOCUMENTS

| | | | | |
|---|---|---|---|---|
| 2005/0253067 | A1* | 11/2005 | Kawada | H01J 37/28 250/310 |
| 2007/0200947 | A1 | 8/2007 | Kobaru et al. | |
| 2009/0001279 | A1* | 1/2009 | Kobaru | H01J 37/21 250/396 R |
| 2009/0140143 | A1* | 6/2009 | Fukuda | H01J 37/026 250/311 |
| 2011/0272578 | A1* | 11/2011 | Hirose | H01J 37/153 250/310 |
| 2012/0138796 | A1* | 6/2012 | Sasajima | H01J 37/28 250/311 |
| 2015/0146967 | A1* | 5/2015 | Miyamoto | H01J 37/28 382/145 |
| 2015/0287201 | A1* | 10/2015 | Shinoda | G06T 7/337 382/144 |
| 2016/0124026 | A1* | 5/2016 | Mullen | H01J 37/244 324/403 |

FOREIGN PATENT DOCUMENTS

| | | |
|---|---|---|
| JP | 4933111 B2 | 5/2012 |
| JP | 5478385 B2 | 4/2014 |

* cited by examiner

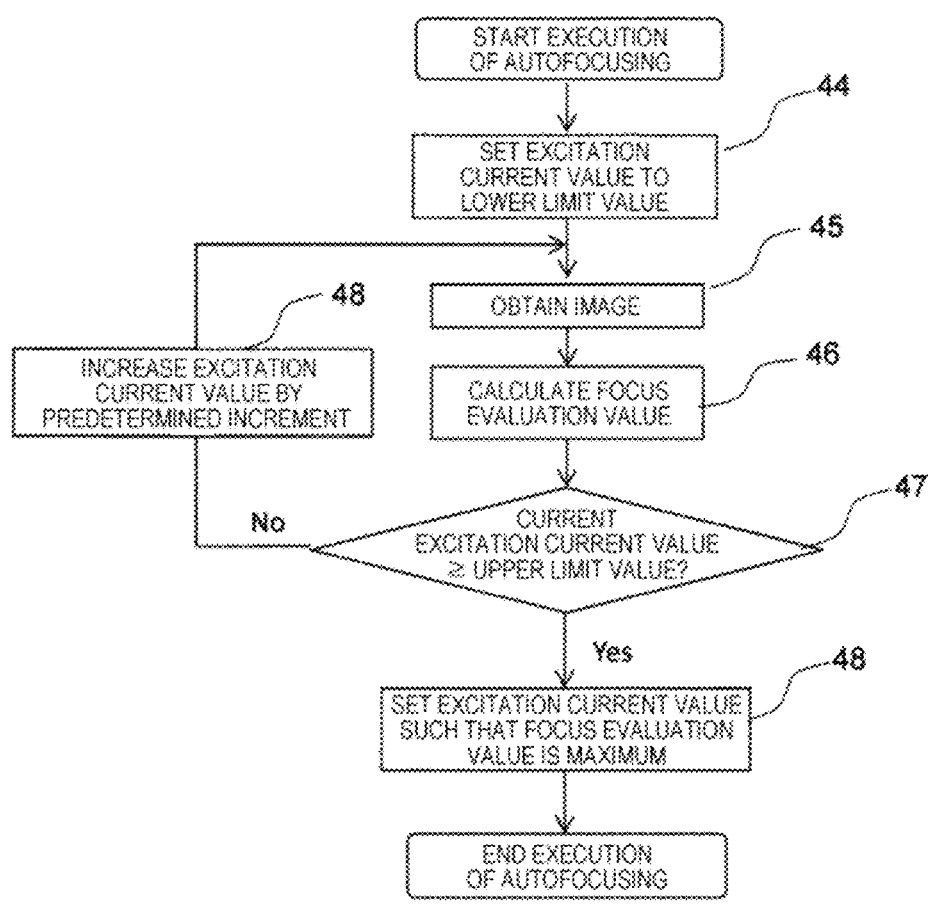

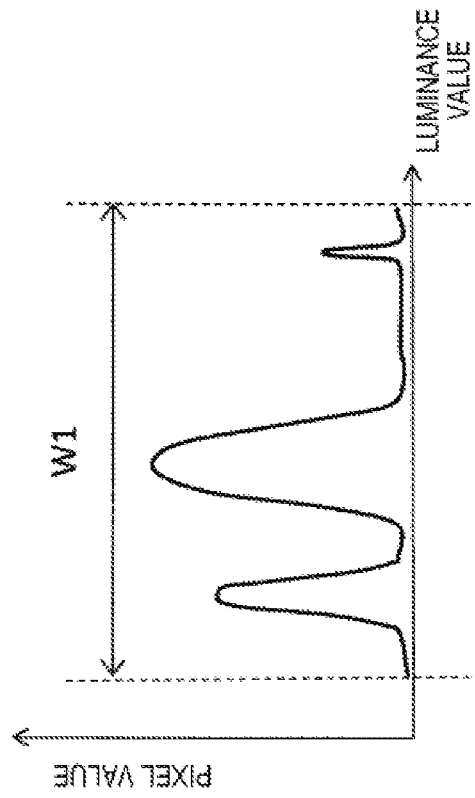
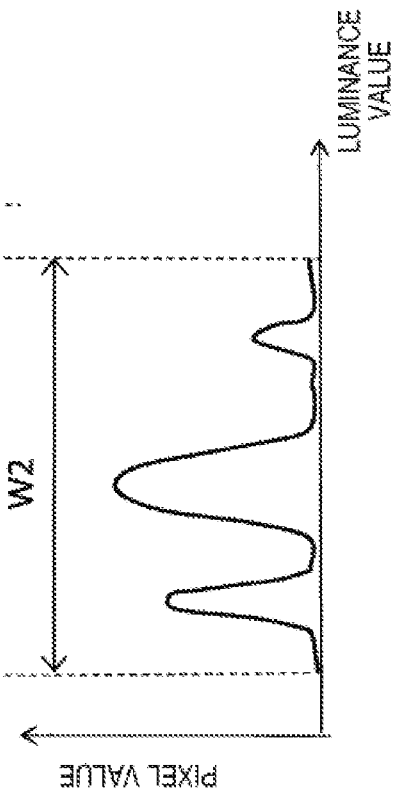
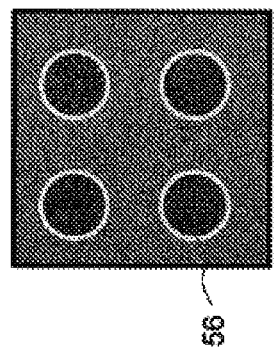
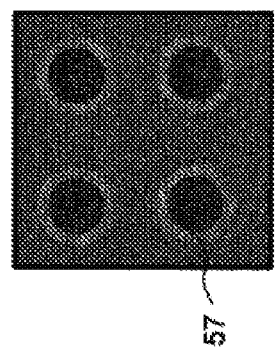

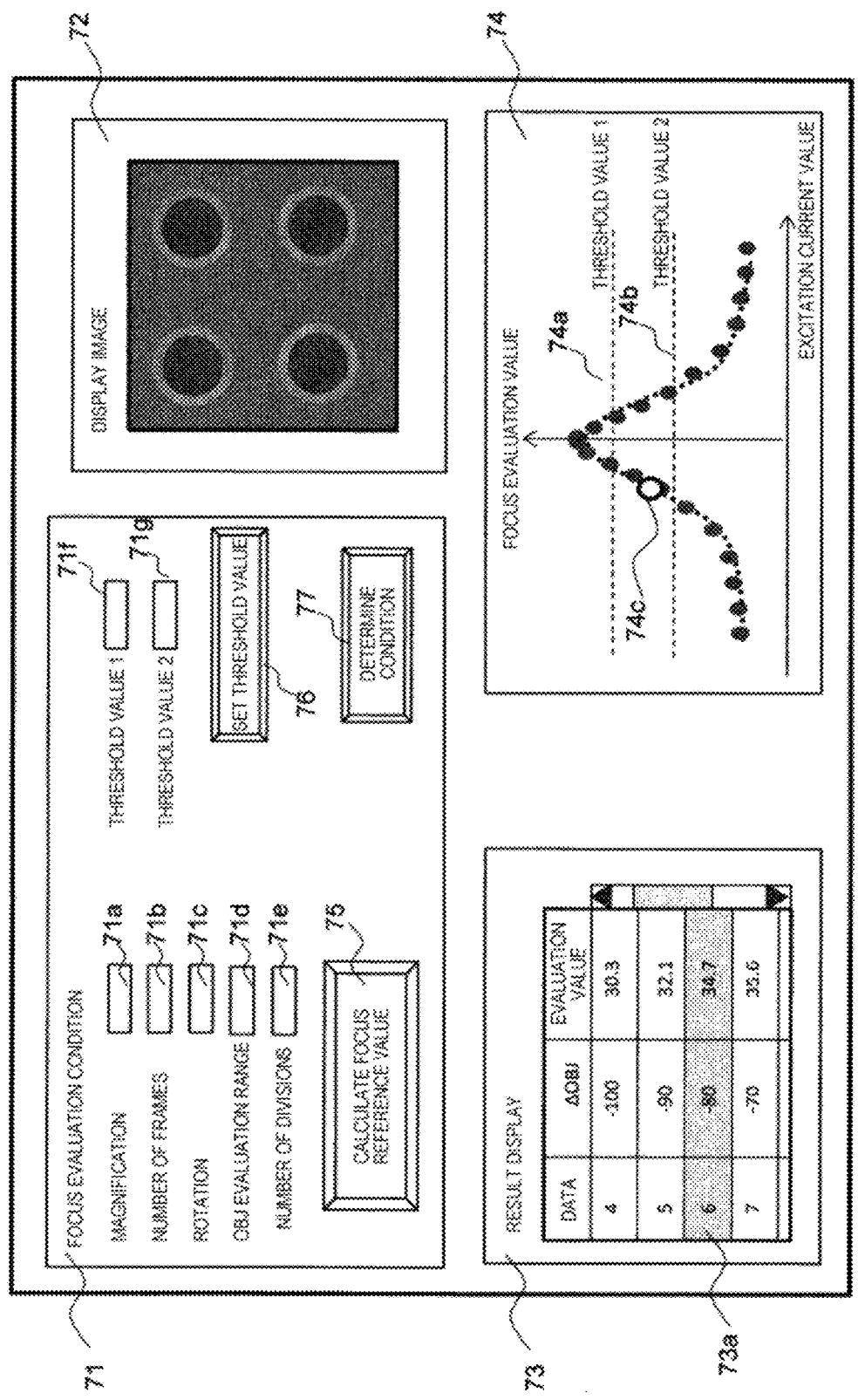

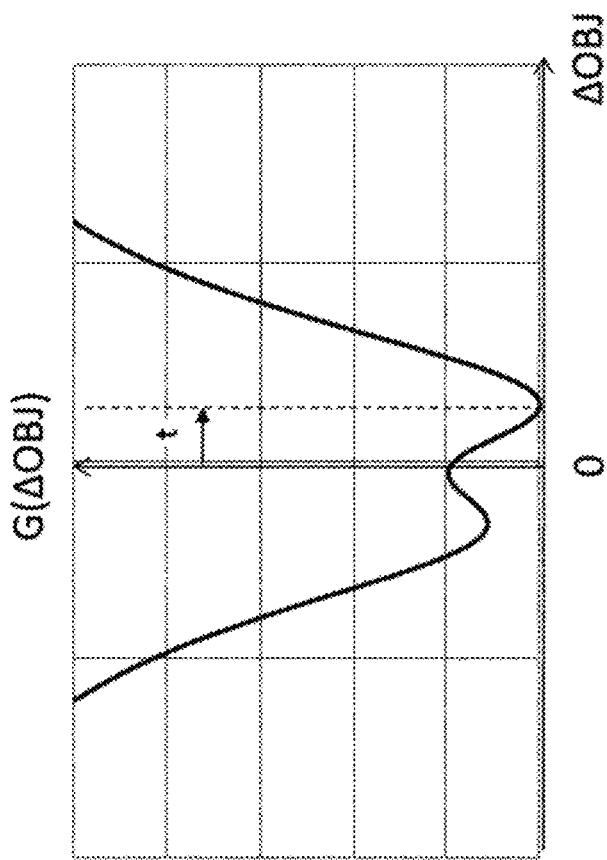

SCANNING ELECTRON MICROSCOPE

TECHNICAL FIELD

The present invention relates to a measurement technique using an electron beam in a process of manufacturing a semiconductor device, and more particularly, to a scanning electron microscope (SEM) focusing technique using a high acceleration voltage.

BACKGROUND ART

As a background art in this technical field, there is disclosed in JP-A-2002-334678 (PTL 1) a method of obtaining an image while changing a focal position (a focus position) by changing an excitation current value of an objective lens, calculating a focus evaluation value at each focal position on the obtained image, and focusing on a position corresponding to a maximum estimated focal value (a focus evaluation value), widely used as an example of a technique for automatically detecting focus of an SEM (automatic focusing technique). Disclosed in JP-A-2010-211973 (PTL 2), a method of adjusting focus by controlling a voltage (retarding voltage) to be applied to a sample has been proposed as a method of adjusting focus at high speeds by solving a problem that it takes time to change an excitation current of an objective lens to adjust focus.

CITATION LIST

Patent Literature

PTL 1: JP-A-2002-334678
PTL 2: JP-A-2010-211973

SUMMARY OF INVENTION

Technical Problem

In general, a magnetic electron lens (magnetic lens) is employed as an objective lens of an electron microscope. It is difficult to accelerate adjusting focus through control of an excitation current of the objective lens, by problems such as lack of responsiveness of the objective lens and hysteresis. When autofocusing is performed, it is necessary to calculate a focus evaluation value by changing an excitation current value of the objective lens many times. Accordingly, an autofocusing time increases and thus a throughput of a tool decreases. On the other hand, a method of adjusting focus by applying a voltage to a sample may be performed at higher speed than the method of adjusting focus through control of an excitation current of an objective lens, and is relatively effective for a scanning electron microscope used with low acceleration voltages. However, a high-performance power supply capable of being precisely controlled at high-voltage range equivalent to that of a high acceleration voltage source the tool is needed to secure voltage range to be applied to a sample sufficient to change a focal position in high acceleration region. This method is not acceptable in terms of costs and size of a tool. Even if such a high-performance power supply can be employed, energy of an electron beam irradiated to a sample changes a lot by retarding voltage adjustment for focusing, as a result the quality of a SEM image will be changed largely. In order to overcome the above problems, the present disclosure provides a means for adjusting focus at high speeds, particularly, in a scanning electron microscope used with high acceleration voltages.

Solution to Problem

In order to overcome the above problems, there is provided a scanning electron microscope including an objective lens configured to converge an electron beam emitted from an electron source, a current source configured to supply an excitation current to the objective lens, a negative-voltage applying power supply configured to form an electrostatic field on a sample, detectors configured to detect charged particles generated when the electron beam is irradiated to the sample, and a control device configured to evaluate focus of the electron beam from an image formed based on an output of the detector. The control device evaluates focus evaluation values before and after of the applied voltage change, determines whether to increase or decrease an excitation current according to increase/decrease direction of the focus evaluation value, and supplies the excitation current according to a result of the determination.

Advantageous Effects of Invention

According to the above configuration, focus of an objective lens can be adjusted without performing a process requiring a large amount of time to calculate focus evaluation values by changing an excitation current value of the objective lens many times whenever autofocusing is performed. In the above configuration, a high-performance power supply capable of being precisely controlled at high voltage range is not necessary to be employed in the tool. A problem of large image quality change can also be prevented with the configuration. Accordingly, high-speed focusing can be performed in high acceleration electron beam region, and the throughput of the tool can be improved.

BRIEF DESCRIPTION OF DRAWINGS

FIG. 3B is a diagram illustrating an autofocusing execution sequence according to Example 1.
FIGS. 4A to 4D are diagrams illustrating a focus evaluation value curve according to Example 1.
FIG. 7 is a diagram illustrating a GUI for setting the focus evaluation value condition according to Example 2.

FIG. 18 is a diagram illustrating the method of calculating the amount of offset current of an objective lens according to Example 4.

DESCRIPTION OF EMBODIMENTS

Figure 1:
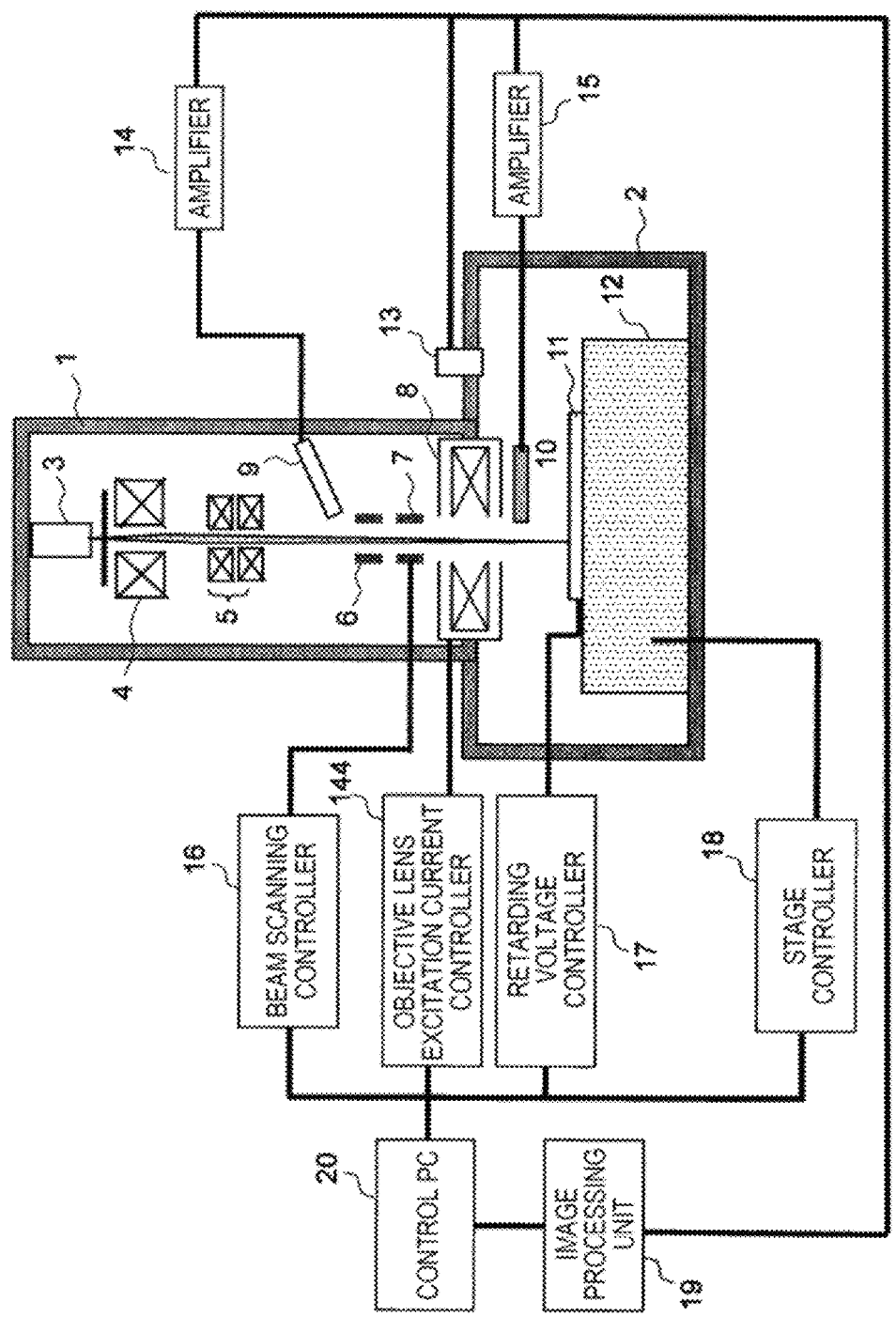
FIG. 1 is a schematic diagram of an example of a configuration of a tool illustrated in Examples 1 to 4.

A semiconductor device is manufactured by repeatedly performing a process of transferring a pattern formed on a photomask onto a semiconductor wafer by lithography and etching. In a process of manufacturing a semiconductor device, the yield of the semiconductor device is greatly influenced by lithography, etching, other defects, foreign substances, and the like. Thus, the pattern on the semiconductor wafer is measured and inspected during the manufacturing process to detect errors or defects occurring in the manufacturing process at an early stage or in advance. A scanning electron microscope (SEM) has been widely used when accurate measurement is required.

In recent years, as smaller and three-dimensional semiconductor devices are being developed, the importance of managing superimposition of patterns between different processes is increasing. In particular, there is a huge demand for overlay measurement with a lower layer pattern using a high acceleration electron beam of 5 kV or more to provide a feedback on a lithography process. Measurement of more than several hundreds of points per wafer is required and thus improvement of throughput is strongly demanded.

In order to increase the throughput of measurement with a scanning electron microscope, it is important to decrease not only a time period for obtaining an image but also a time period required to adjust focus of an electron beam to be irradiated.

Hereinafter, a scanning electron microscope capable of adjusting focus at high speeds, particularly, in a high acceleration region will be described in detail.

In Examples which will be described below, a pattern measuring device for measuring a pattern on a semiconductor wafer will be described as an example of a scanning electron microscope, but the "scanning electron microscope" should be understood to broadly include tools capable of capturing an image of a sample by using an electron beam. Other examples of the scanning electron microscope include an inspection tool using a scanning electron microscope, a reviewing device, a general-purpose scanning electron microscope, a sample processing device or a sample analyzing device equipped with a scanning electron microscope and the like, and the present disclosure is applicable to these tools. In Examples which will be described below, the scanning electron microscope should be understood to include either a system to which the scanning electron microscope is connected via a network or a multi-function peripheral including a combination of a plurality of scanning electron microscopes as described above.

In Examples which will be described below, a "sample" will be described as an example of a semiconductor wafer on which a pattern is formed, but the present invention is not limited thereto, and the sample may be a metal, ceramic, or biological sample, or the like.

In Examples which will be described below, an "excitation current value" of the objective lens will be described as, for example, a current value for exciting the objective lens, which is set directly as a tool parameter. However, the present invention is not limited thereto and the excitation current value may be calculated using the height and a focal length of a sample which are set via a GUI.

In Examples those will be described below, "measurement" in relation to a scanning electron microscope which measures a pattern on a semiconductor wafer is described as, for example, measuring a dimension of the pattern on the semiconductor wafer, but it is limited thereto and may be understood as observation and inspection of the pattern.

In Examples those will be described below, a "retarding voltage" is described as, for example, an applied voltage which is set as a tool parameter in a method of controlling focus by controlling a voltage applied to a sample. However, the present invention is not limited thereto, and the retarding voltage may be set by assigning a range of setting applied voltages to a predetermined number of bits, such as 8 bits or 16 bits, and setting as a value within the range via a GUI.

Example 1

FIG. 1 is a diagram illustrating an example of a configuration of a scanning electron microscope for measuring a pattern on a semiconductor wafer according to Example 1, in which a main body of the tool includes a column 1 which is an electron optical system, and a sample chamber 2. The column 1 includes an electron gun 3, a condenser lens 4, an objective lens 8, a deflector 7, an aligner 5, a secondary electron detector 9, an ExB filter 6, and a backscattered electron detector 10. A primary electron beam (electron beam to be emitted) generated by the electron gun 3 is focused and irradiated onto a wafer 11 via the condenser lens 4 and the objective lens 8. The aligner 5 aligns a position of the primary electron beam to be incident on the objective lens 8. The primary electron beam is scanned with respect to the wafer 11 by the deflector 7. The deflector 7 scans the primary electron beam with respect to the wafer 11 according to a signal from a beam scanning controller 16. Secondary electrons generated on the wafer 11 by irradiating the primary electron beam are directed toward the secondary electron detector 9 by the ExB filter 6, and detected by the secondary electron detector 9. An electron reflected from the wafer 11 is detected by the backscattered electron detector 10. A signal obtained by irradiating an electron beam, which is a generic term for the secondary electron and the reflected electron, to a sample will be referred to as a signal electron. The electron optical system may further include other lenses, electrodes, and detectors, some components of the electron optical system may be different from the above components, and the configuration of the electron optical system is not limited thereto. An excitation current is supplied to the objective lens 8 by an objective lens excitation current controller 144. A retarding voltage is applied to the wafer 11 by a retarding voltage controller 17. An XY stage 12 installed in the sample chamber 2 moves the wafer 11 with respect to the column 1 according to a signal from a stage controller 18. The device further includes an optical microscope 13 for wafer alignment. Signals from the secondary electron detector 9 and the backscattered electron detector 10 are signal-converted by an amplifier 14 and an amplifier 15, and then are transmitted to an image processing unit 19 to obtain images. Overall operations of a pattern dimension measuring device of the present embodiment are controlled by a control PC 20. The control PC 20 includes an input unit, such as a mouse or a keyboard, for inputting a command by a user; an output unit, such as a monitor or a printer, for displaying or printing an image, a result of measurement, or the like which is output from the tool; and a storage unit such as a hard disc or a memory.

The scanning electron microscope further includes a controller for controlling the operation of each component thereof, an image generator for generating an image based on a signal output from a detector, voltage sources for applying voltages to various types of lenses, a deflector, an electrode, a detector, a circuit board, and the like, a current source for supplying current to the various types of lenses, the deflector, the electrode, the detector, the circuit board, and the like (not shown). The controller and the image generator may be configured by hardware on a dedicated circuit board or may be configured by software executed by a computer connected to the scanning electron microscope. When the controller and the image generator are configured by hardware, they can be realized by integrating a plurality of operation units which execute processing either on a wiring substrate or in a semiconductor chip or a package. When the controller and the image generator are configured by software, they can be realized by installing a high-speed general-purpose CPU in a computer and executing a program that executes desired arithmetic processing. An existing device may be upgraded using a recording medium on which the program is recorded. Such a device, a circuit, and a computer are connected via a wired or wireless network to appropriately transmit and receive data there between.

Figure 2:
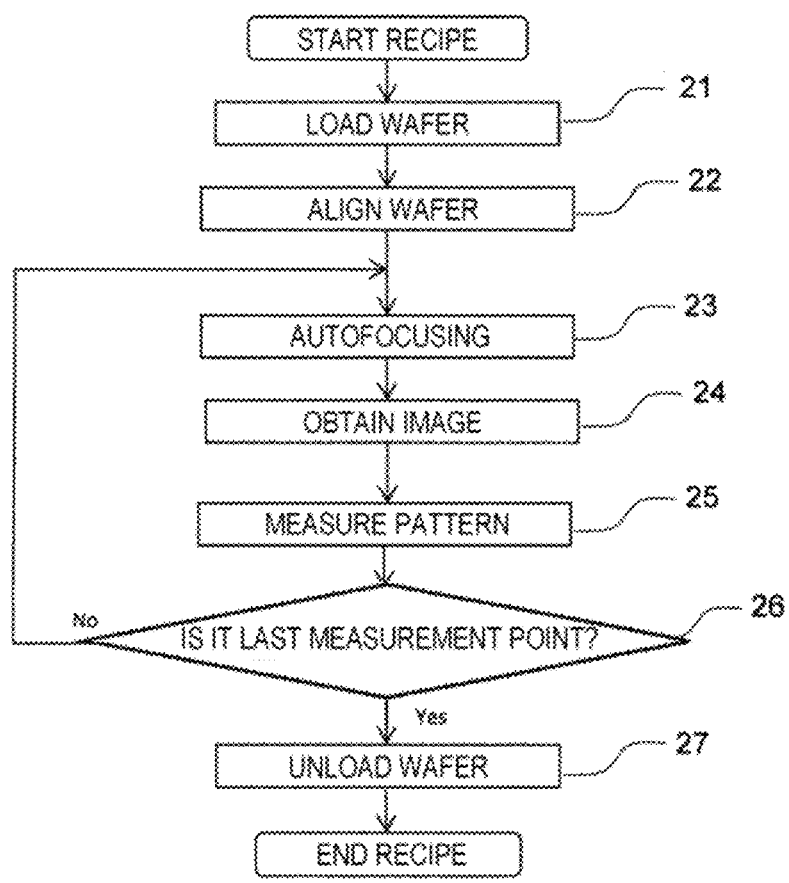
FIG. 2 is a diagram illustrating a sequence of a recipe according to Example 1.

FIG. 2 illustrates a sequence of operations of a recipe performed by a scanning electron microscope for measuring a pattern on a semiconductor wafer, according to Example 1. The recipe refers to a collection (program) of data designated as a procedure, a processing method, and parameters given to the tool. When the recipe is executed, the wafer 11 is loaded into the sample chamber 2 (step 21), and alignment of the wafer 11 is executed (step 22). Thereafter, autofocusing (step 23), image acquisition (step 24), and pattern measurement (step 25) are performed at each measurement point registered in the recipe. After the pattern measurement is executed, it is determined whether or not it is the last measurement point (step 26). When operations at the last measurement point are completed, the wafer 11 is unloaded (step 27).

Figure 3A:
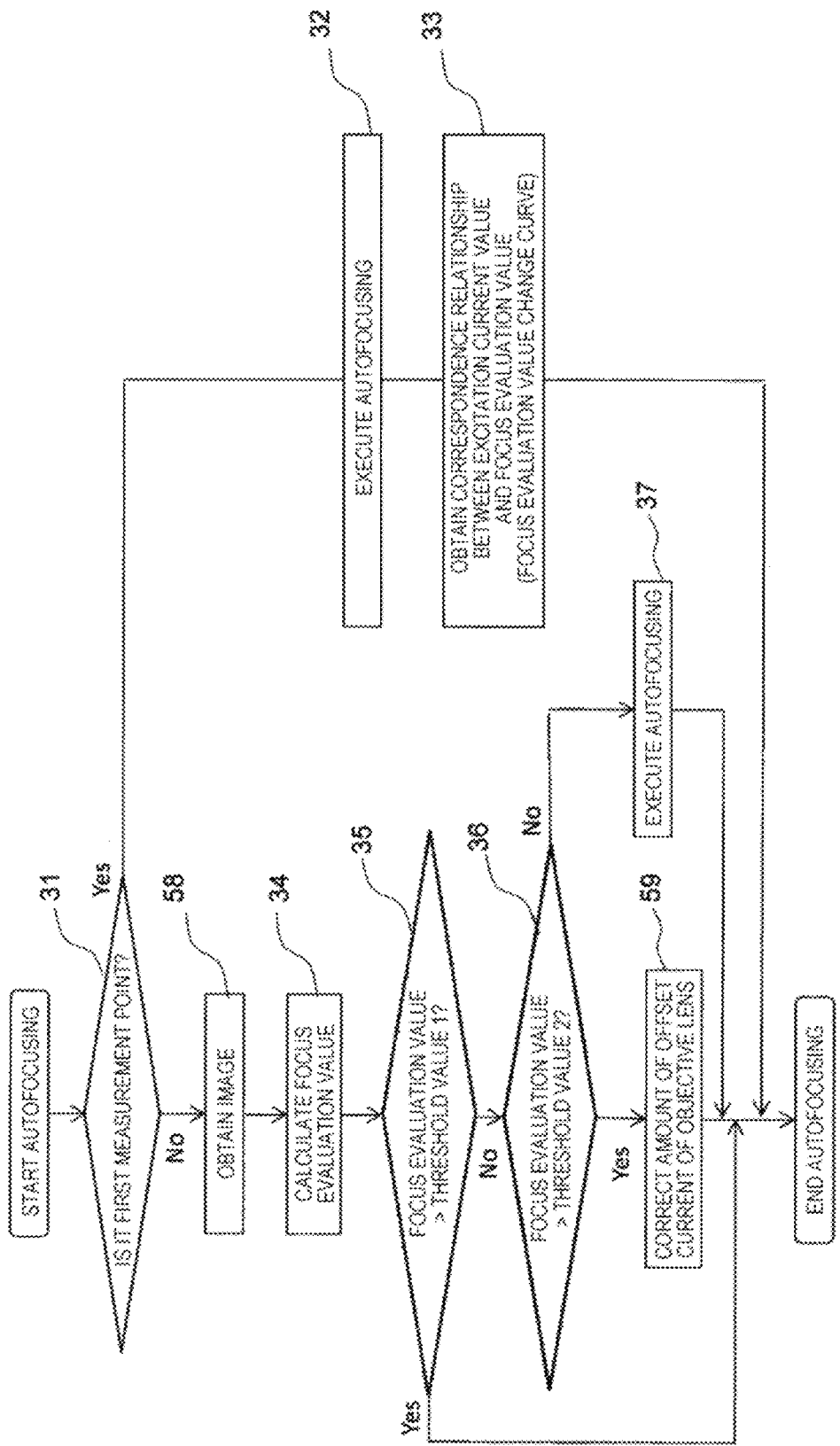
FIG. 3A is a diagram illustrating an autofocusing sequence in a recipe according to Example 1.

A sequence of executing autofocusing (step 23) illustrated in FIG. 2 of Example 1 will be described with reference to FIGS. 3(A), 3(B), 3(C), 4 and 5 below. As illustrated in FIG. 3(A), after the start, it is determined whether or not it is a first measurement point (step 31). When it is the first measurement point, autofocusing is executed (step 32). An autofocusing sequence is illustrated in FIG. 3(B). An excitation current value of an objective lens is set to a lower limit value (step 44), an image is acquired (step 45), and a focus evaluation value is calculated (step 46). In step 47, it is determined whether or not the present excitation current value is greater than or equal to an upper limit value. When the present excitation current value is less than the upper limit value, the excitation current value is increased by a predetermined increment and then an image is acquired again (step 45), and a focus evaluation value is calculated (step 46). The acquiring of an image and the calculating of a focus evaluation value are repeatedly performed until the present excitation current value becomes greater than or equal to the upper limit value (step 47), thereby obtaining a plurality of focus evaluation values corresponding to a plurality of excitation currents. An excitation current value at which a focus evaluation value is maximum is set (step 48), and autofocusing is completed. The relationship between the plurality of excitation current values (OBJ values) of the objective lens obtained during the autofocusing and the plurality of focus evaluation values is identified (step 33). In this case, a focus evaluation value and an excitation current value at a point at which focus is most appropriate are set as a focus reference value and a focusing current value $OBJ_{JUST}$, respectively.

As the focus evaluation value, for example, a luminance width of a luminance value histogram of the image is used. FIG. 4 illustrates an image A that is focused, a luminance value histogram (B) of the image (A), an image (C) that is out of focus, and a luminance value histogram (D) of the image (C). When the image is focused, an image with clear pattern edge (56) is captured and thus the width (luminance width) W1 between the maximum luminance value and the minimum luminance value is large in the luminance value histogram of the image. On the other hand, when the image is out of focus, an image with blurred pattern edge (57) is captured and thus the luminance width W2 in the luminance value histogram of the image is smaller comparing with the luminance width W1 of the focused image A. An index used as a focus evaluation value is not limited to the luminance width described above, and a standard deviation of an image or an average value of a differential image can be used.

Figure 5:
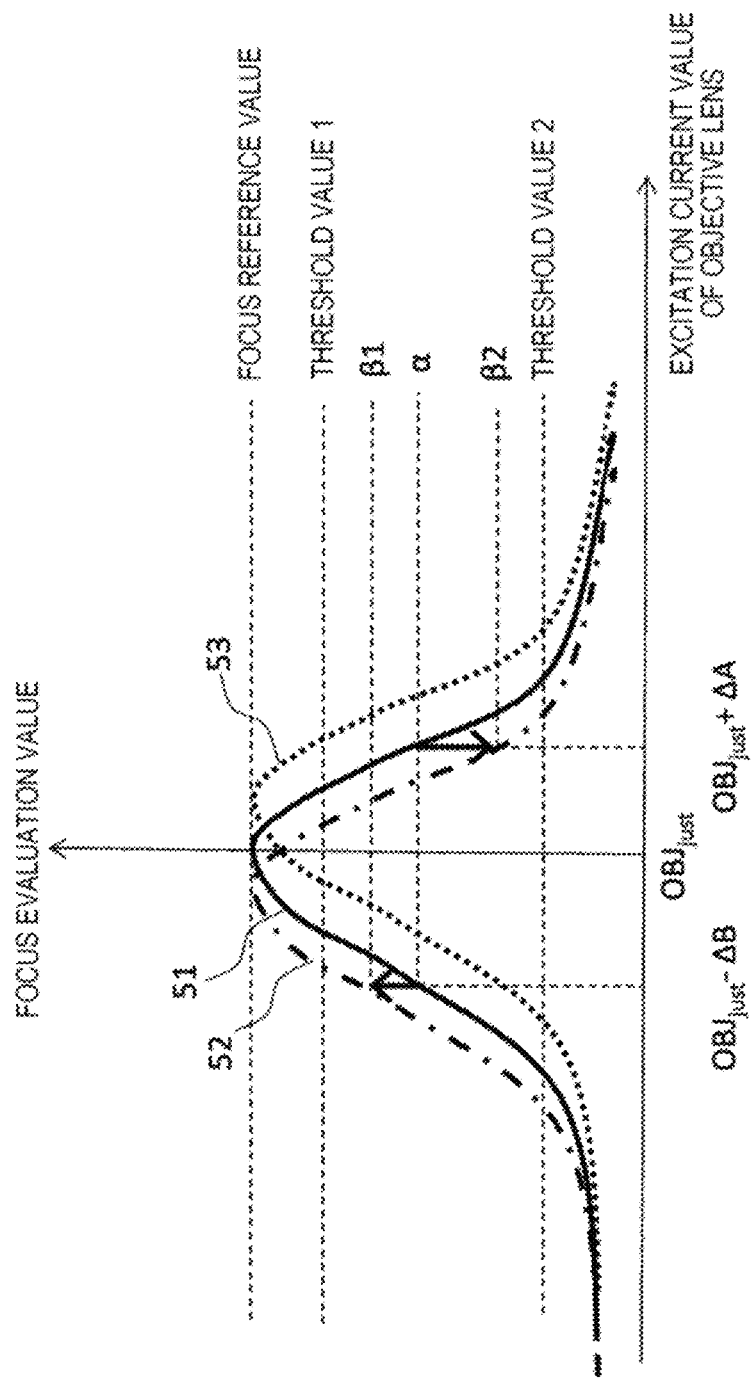
FIG. 5 is a diagram illustrating a method of calculating an evaluation value according to Example 1.

FIG. 5 is a diagram illustrating the relationship between a luminance width as a focus evaluation value and an excitation current value of an objective lens. The relationship between the excitation current values and the focus evaluation values which is obtained in step 33 can be represented with a focus evaluation value change curve 51. When the luminance width is used as an index of a focus evaluation value, the focus evaluation value becomes maximum at a point where image is focused, and decreases as focus error increase.

If a measurement point is determined in step 31 of FIG. 3(A) as second measurement point or later, an image is acquired (step 58) without performing the autofocusing sequence of FIG. 3(B), and a focus evaluation value is calculated (step 34). The obtained focus evaluation value is compared with the threshold value 1 (step 35). Here, focus adjustment is considered not to be necessary if a focus evaluation value is larger than the threshold value 1. The threshold value 1 is set as, for example, a ratio to a focus reference value in the recipe in advance. In step 35, if the focus evaluation value is larger than the threshold value 1, proceed to additional image acquisition (step 24) of FIG. 2 without performing the autofocusing process of FIG. 3(B). If the focus evaluation value is equal to or smaller than the threshold value 1, the focus evaluation value is compared with the threshold value 2 (step 36). A focus shift due to a change in retarding voltage can be measured accurately enough to correct the focus error if the focus evaluation value is larger than the threshold value 2. The threshold value 2 is set as, for example, as a ratio to the focus reference value in the recipe in advance. If the focus evaluation value is larger than the threshold value 2, the amount of offset current of the objective lens is corrected without performing the autofocusing sequence of FIG. 3(B) (step 59). Conversely, if the focus evaluation value is equal to or less than the threshold value 2, the autofocusing sequence illustrated in FIG. 3(B) is performed (step 37).

Figure 3C:
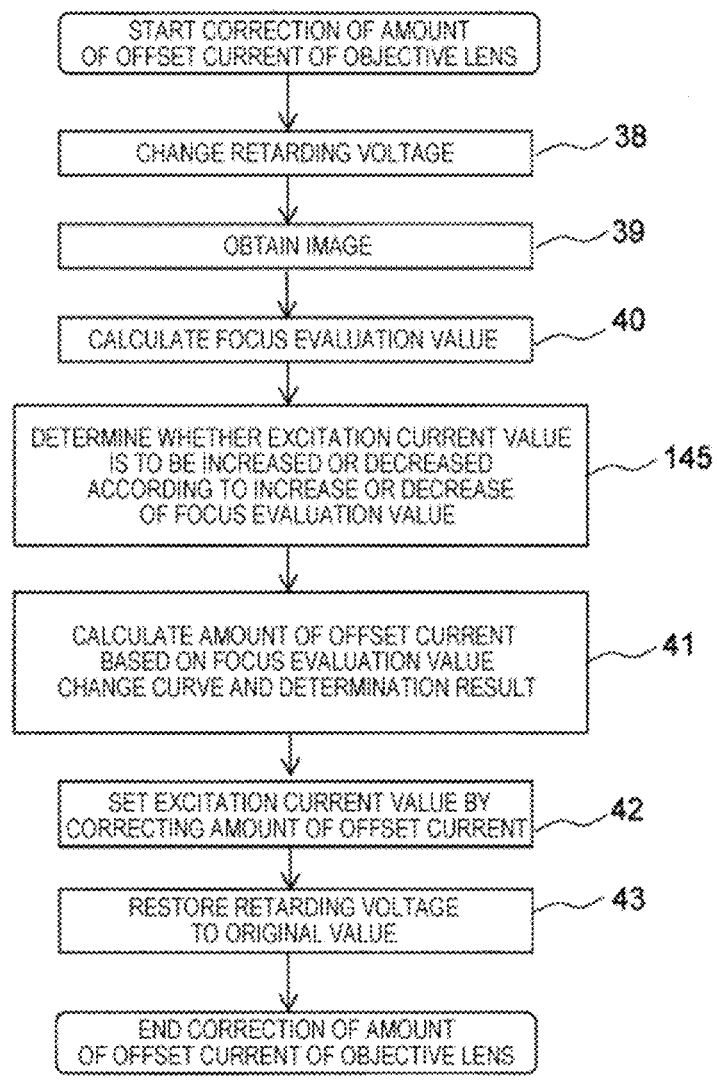
FIG. 3C is a diagram illustrating a sequence of correcting an offset current of an objective lens according to Example 1.

A sequence of correcting the amount of offset current of the objective lens will be described with reference to FIG. 3(C) below. First, after changing the retarding voltage by a predetermined voltage (step 38), an image is acquired under predetermined conditions (step 39), and a focus evaluation value is calculated (step 40). It is determined whether to increase or decrease the excitation current according to increase/decrease direction of the focus evaluation value when the retarding voltage is changed (step 44). The amount of offset from the focusing current $OBJ_{MS}m$ of the objective lens can be calculated, based on the focus evaluation value after the retarding voltage is changed, the focus evaluation value before the retarding voltage change which is calculated in step 34, and the relationship between the excitation current value of the objective lens and the focus evaluation value (the focus evaluation value change curve) acquired at the first measurement point (acquired in step 33 of FIG. 3(A)) (step 41).

As illustrated in FIG. 5, when the retarding voltage is changed by the predetermined voltage, the focus evaluation value change curve 51 obtained in step 33 is shifted to a left curve 52 or a right curve 53 with respect to an axis of the focusing current value at $OBJ_{JUST}$ according to the polarity of the predetermined voltage. The amount of offset from the focusing current value $OBJ_{JUST}$ of the objective lens is calculated based on the above feature. For example, the retarding voltage is changed in step 38 such that the focus evaluation value change curve 51 is changed to the left curve 52. If the focus evaluation value calculated before the retarding voltage change in previous step 34 is α, the possible amount of offset of the objective lens from the focusing current value $OBJ_{JUST}$ is judged to be either −ΔB or +ΔA according to the focus evaluation value change curve 51 when autofocusing. Next, whether the amount of offset current calculated from the focused current value $OBJ_{JUST}$ of the objective lens is −ΔB or +ΔA is determined, based on whether the focus evaluation value after the change of the retarding voltage is increased or decreased as compared with a focus evaluation value a that is calculated before the change of the retarding voltage. That is, the amount of offset calculated from the focusing current value $OBJ_{JUST}$ is determined to be −ΔA when the focus evaluation value after the change of the retarding voltage is β1, and is determined to be +ΔB when the focus evaluation value after the change of the retarding voltage is β2.

Next, an excitation current value is set by correcting the calculated amount of offset current of the objective lens (step 42), and the retarding voltage is restored to the original value (step 43). In step 42, the excitation current to be supplied to the objective lens may be changed, increased or decreased, based on the amount of offset current.

According to Example 1, an appropriate excitation current can be supplied or an excitation current can be corrected to focus on a desired measurement point via an objective lens without performing a process requiring a large amount of time to calculate a focus evaluation value by changing the excitation current value of the objective lens many times whenever autofocusing is performed. As a result, it is unnecessary to calculate the focus evaluation value by changing the excitation current value of the objective lens many times when autofocusing, and thus, an autofocusing time can be decreased, thereby improving the throughput of the tool.

According to Example 1, an effect of decreasing a time of a recipe execution as compared to a case in which autofocusing is performed with respect to all focus evaluation values which are equal to or less than the threshold value 1 can be achieved. An effect of improving the precision of focus adjustment as compared to a case in which focus adjustment is not performed with respect to focus evaluation values which are larger than or equal to the threshold value 2 can be achieved.

Example 2

Next, adjustment of focus of a scanning electron microscope that measures a pattern according to Example 2 will be described. In Example 2, data necessary for calculating an amount of offset current of an objective lens is measured in advance and stored in a recipe.

Figure 6A:
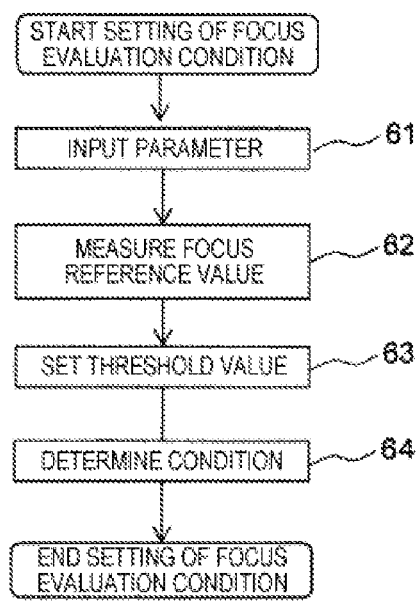
FIGS. 6A and 6B are diagrams illustrating a sequence of setting a focus evaluation value condition according to Example 2.
Figure 6B:
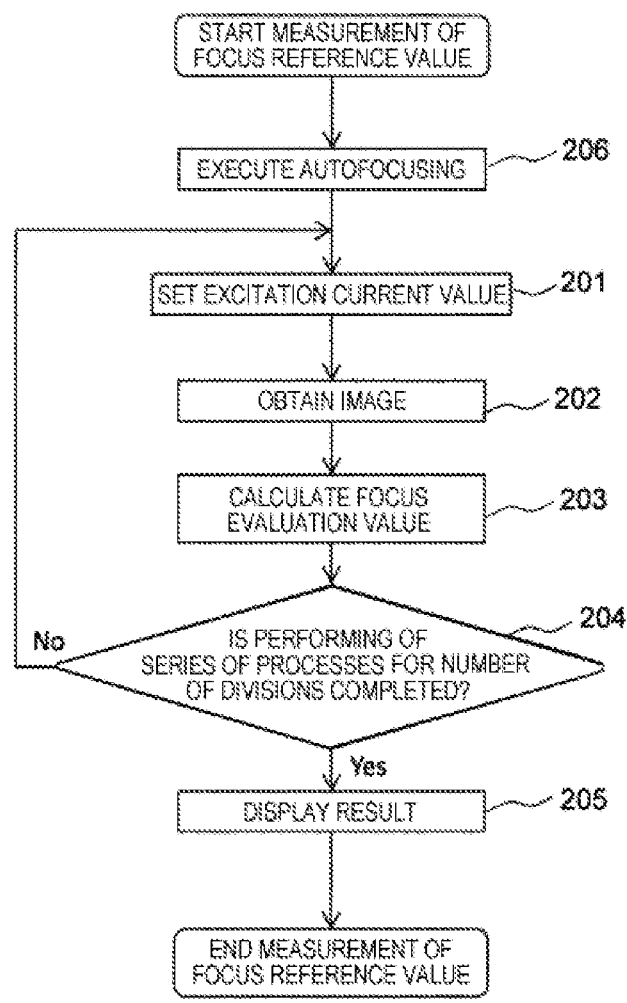

First, a process of determining a focus reference value, threshold value 1, and threshold value 2 which are set by the recipe will be described with reference to FIGS. 6 and 7. FIG. 6 illustrates a sequence of setting a focus evaluation condition. FIG. 7 is a diagram illustrating a GUI for setting the focus evaluation condition according to the sequence of FIG. 6. First, in a focus evaluation condition setting area (71), parameters of the focus evaluation condition such as a magnification (71a), a number of frames (71b), rotation (71c), an OBJ evaluation range (71d), and a number of divisions (71e) are input (step 61). The magnification (71a), the number of frames (71b), and the rotation (71c) are parameters for setting an image acquisition condition. The OBJ evaluation range (71d) is a range of scanning the excitation current of the objective lens to calculate the focus reference value, the threshold value 1, and the threshold value 2. The number of divisions (71e) is a parameter for determining how to divide the OBJ evaluation range (71d) to calculate a focus evaluation value. Next, measurement of the focus reference value (step 62) is performed, and a procedure of step 62 is illustrated in FIG. 6(B) in detail. When a focus reference value calculation button (75) is clicked, first, autofocusing is performed to adjust focus of an image (step 206). Next, according to the setting of the OBJ evaluation range (71d) and the number of divisions (71e), a series of processes, including setting an excitation current of the objective lens (step 201), obtaining an image (step 202), and calculating a focus evaluation value (step 203), are repeatedly performed for the number of divisions with respect to a focal position. It is determined whether the series of processes has already been repeated for the number of divisions (step 204), and if all the repetition processes is completed, a resultant focus evaluation value corresponding to a variation (ΔOBJ) of the excitation current value of the objective lens from the focal position is displayed in the result display area (73) and the focus evaluation value change curve display area (74) illustrated in FIG. 7 (step 62f). When an arbitrary data row (73a) is selected in the result display area (73), the data point (74c) corresponding thereto is highlighted in the focus evaluation value change curve display area (74), and at the same time, an image corresponding to the data point (74c) is displayed in the image display area (72). Next, parameters of threshold value 1 (71f) and threshold value 2 (71g) are input. After the inputting of threshold value 1 (71f) and threshold value 2 (71g), the threshold value determination button (76) is clicked to update and display the dotted line (74a) indicating the threshold value 1 and the dotted line (74b) indicating the threshold value 2 in a focus evaluation value graph. Threshold value 1 is set by checking an image displayed in the image display area (72), so that focus adjustment is not necessary if a focus evaluation value is larger than the threshold value 1. Threshold value 2 is set such that the differences from evaluation values of preceding and succeeding OBJ set values are large sufficient to accurately determine increase/decrease of the focus evaluation value due to a change of retarding voltage, by checking as the gradient of the graph at the intersection with the threshold value 2 on the focus evaluation value change curve display area (74). Finally, the condition determination button (77) is clicked to determine the focus evaluation condition, that is, the focus reference value, the threshold value 1, and the threshold value 2.

Next, a sequence of executing a recipe for setting the focus evaluation condition will be described. The sequence of the entire recipe is the same as that of Example 1, and an autofocusing sequence included in the recipe will be described with reference to FIG. 8 below. In autofocusing, first, a focus evaluation value is calculated (step 81). The calculating of the focus evaluation value will be described with reference to FIG. 8(B) below. With the focus evaluation condition, the first image is acquired (step 81a). Thereafter, a predetermined offset voltage is added to the retarding voltage (step 81b), and the second image is acquired (step 81c). Finally, the retarding voltage is restored to the original value (step 81d). In parallel with the acquisition of the images and the changing of the retarding voltage, the image processing unit 19 calculates the first focus evaluation value for the first image (step 81e), calculates the second focus evaluation value for the second image (step 81f), and calculates the amount of offset current from a focusing current value of the objective lens (step 81g). Here, the amount of offset current from the focusing current value of the objective lens is determined as follows. First, two candidates, one is positive value and the other is negative value as described before with refer to FIG. 5, are selected according to the relationship between the first focus evaluation value and the focus evaluation value change curve measured based on the sequence of setting the focus evaluation condition of FIGS. 6(A) and 6(B). Then the amount of offset current of the objective lens to be corrected is determined by comparing the second focus evaluation value and the first focus evaluation value.

Figure 8A:
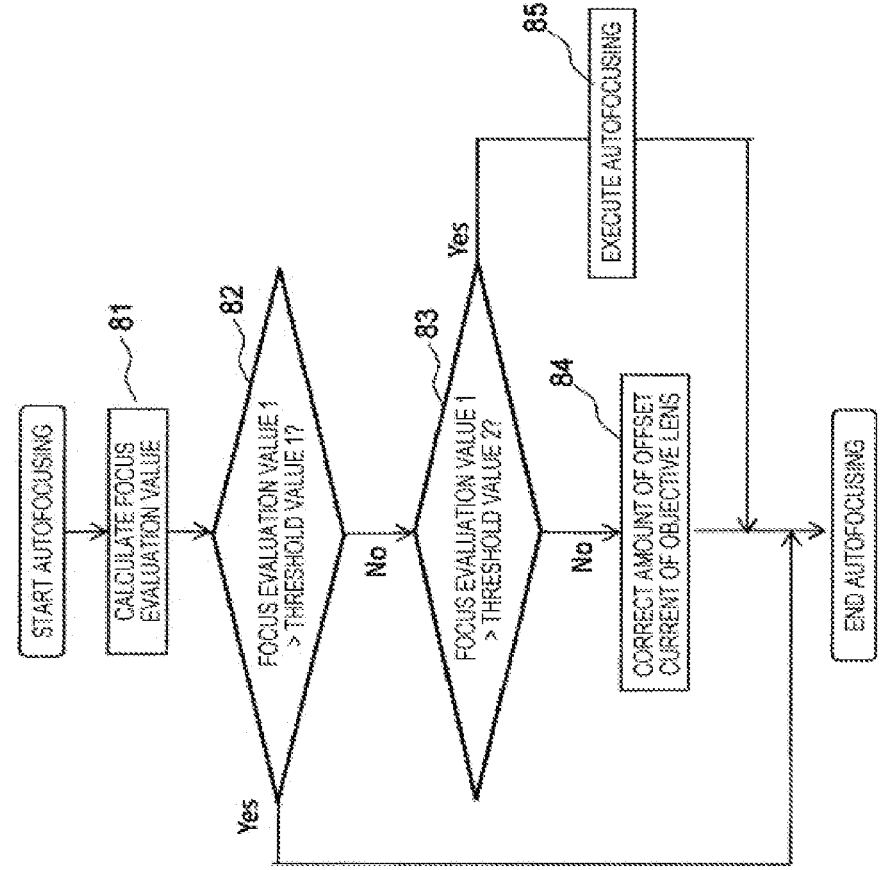
FIGS. 8A and 8B are diagrams illustrating an autofocusing sequence in a recipe according to Example 2.
Figure 8B:
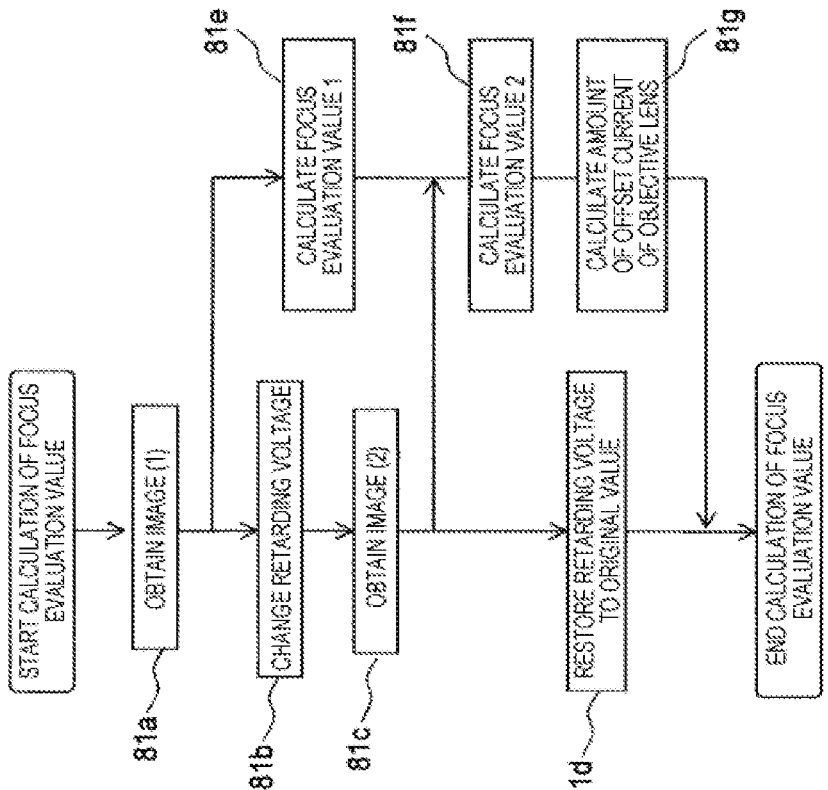

In the sequence of FIG. 8(A), the focus evaluation value 1 is compared with the threshold value 1 (step 82), and autofocusing is completed without correcting the excitation current value of the objective lens if the focus evaluation value 1 is larger than the threshold value 1. If the focus evaluation value 1 is equal to or less than the threshold value 1, the focus evaluation value 1 and the threshold value 2 are compared with each other (step 83). If the focus evaluation value 1 is larger than the threshold value 2, the excitation current value of the objective lens is corrected by the calculated amount of offset current (step 84). If the focus evaluation value 1 is equal to or less than the threshold value 2, autofocusing is executed by changing the excitation current value of the objective lens (step 85).

According to Example 2, an appropriate excitation current can be supplied or an excitation current can be corrected to focus on a desired measurement point via an objective lens without performing a process requiring a large amount of time to calculate a focus evaluation value by changing an excitation current value of the objective lens many times whenever autofocusing is performed. Accordingly, a focus evaluation value need not to be calculated by changing the excitation current value of the objective lens for autofocusing and thus an autofocusing time can be reduced to improve the throughput of the tool.

According to Example 2, a focus evaluation value and a corresponding image can be confirmed via a GUI, thereby a recipe can be created and optimized efficiently. Calculation of a focus evaluation value of a first image and acquisition of a second image can be performed in parallel, thereby it is possible to reduce a time of autofocusing process with correct the excitation current of the objective lens.

Example 3

In Example 3, an example in which focus evaluation value change curves with respect to multiple retarding voltages those are within retarding voltage setting range of the tool are obtained in advance will be described below. In autofocusing process, focus evaluation values are obtained with the same retarding voltages and compared with the focus evaluation values of each objective lens offset in the focus evaluation value change curves. The amount of offset current of an objective lens is determined as the offset where the total sum of differences is minimum. The objective lens current can be corrected accurately with this method.

Figure 9A:
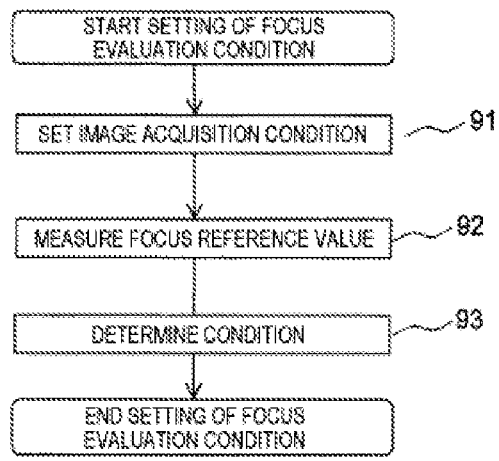
FIGS. 9A and 9B are diagrams illustrating a sequence of setting a focus evaluation value condition according to Example 3.
Figure 9B:
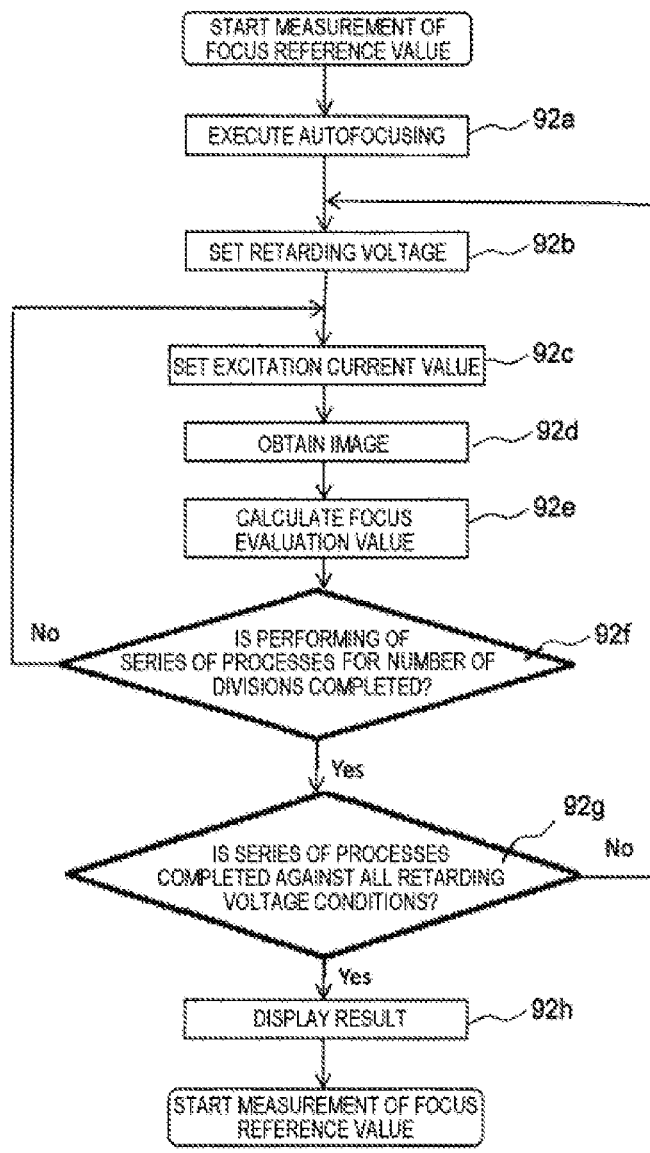
Figure 10:
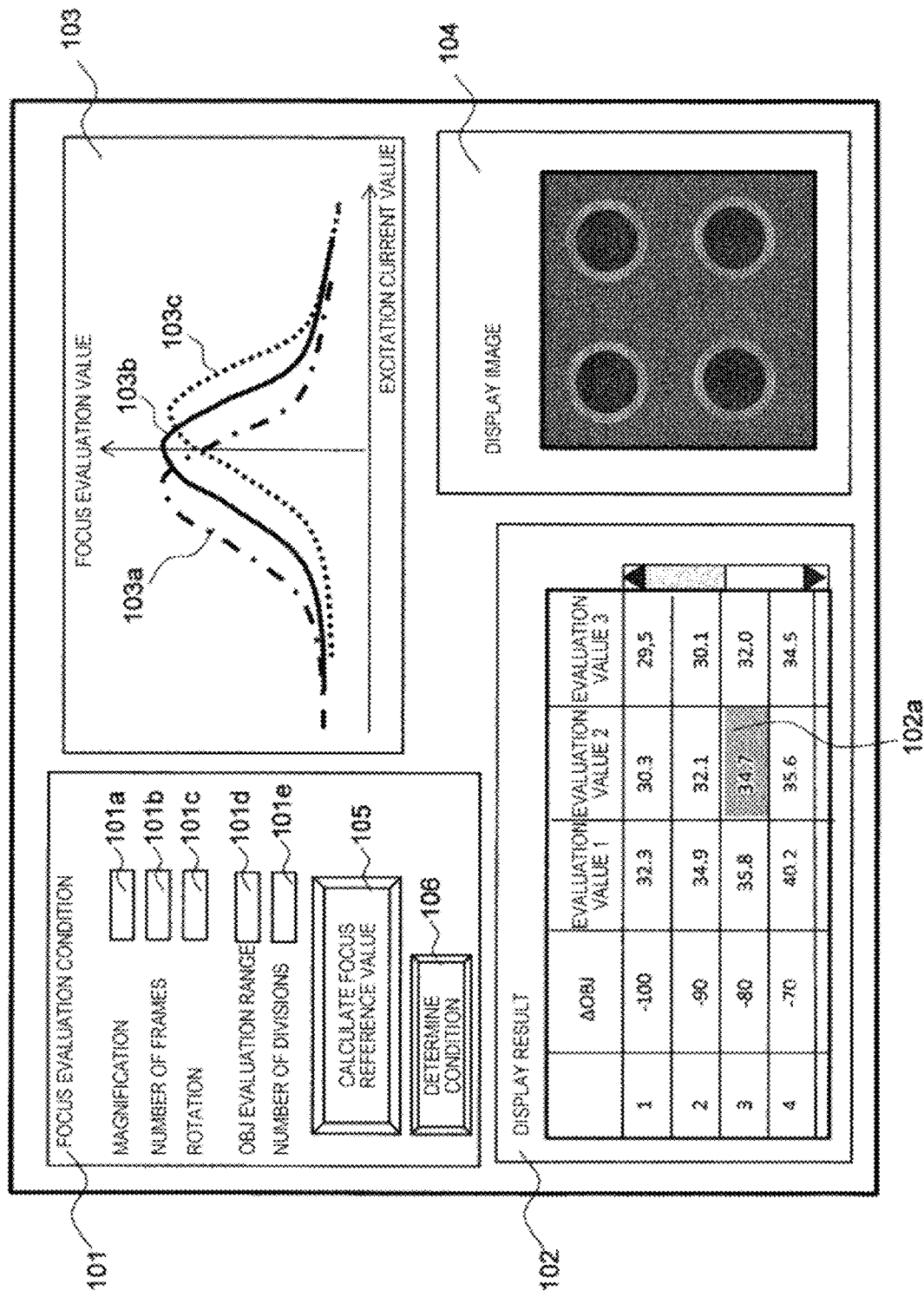
FIG. 10 is a diagram illustrating a GUI for setting the focus evaluation value condition according to Example 3.

First, a sequence of setting a focus evaluation condition in a recipe according to Example 3 will be described with reference to FIGS. 9 and 10. First, in setting an image acquisition condition (step 91) of FIG. 9, in the focus condition setting area (101) of the GUI illustrated in FIG. 10, magnification (101a), number of frames (101b), and rotation (101c) are input as parameters of image acquisition condition, and OBJ evaluation range (101d) and number of divisions (101e) are input as parameters of objective lens excitation current changing condition. Next, the focus reference value calculation button (105) is clicked to measure a focus reference value (step 92).

A sequence of measuring a focus reference value will be described with reference to FIG. 9(B) below. First, autofocusing is executed to determine a reference excitation current value of the objective lens (step 92a). Next, a retarding voltage is set as a first condition (step 92b), and a series of processes, including setting an excitation current value (step 92c), image acquisition (step 92d), and calculating a focus evaluation value (step 92e), are repeatedly performed as many as the number of divisions base on the settings of image acquisition condition and objective lens excitation current changing condition. Whether the series of processes has been repeated as many as the number of divisions or not is determined (step 92f). If the process has already been repeated for all deviations, it is determined whether the repetition process including the steps from 92b to 92f has been completed for all retarding voltage conditions (step 92g). If the repetition process has not been completed, the series of processes, including the steps from 92b to 92f, are repeated with changing retarding voltage setting. Upon completion of data acquisition under all the retarding voltage conditions, a result of the data acquisition is displayed on the GUI (step 92h). In the GUI of FIG. 10, all focus evaluation values are displayed in the form of a table in the result display area (102). Here, ΔOBJ represents the amount of offset current from the focusing current value of the objective lens, and evaluation values 1 to 3 represent focus evaluation values respectively obtained under first to third retarding voltage conditions. In Example 3, the retarding voltage conditions are defined as tool parameters as an offset amount from a reference voltage, and are −10 V, 0 V, and +10 V, respectively. The values can be maintained for each optical condition such as acceleration voltage, or the values can be input via a GUI. When the evaluation value (102a) from the list of focus evaluation values on the result display area (102) is clicked, the obtained image corresponding thereto is displayed in the image display area (104). Focus evaluation value change curves of focus evaluation value 1 (103a), focus evaluation value 2 (103b), and focus evaluation value 3 (103c) of an excitation current value of the objective lens are displayed in the graph display area (103). When the displayed focus evaluation value change curves are shifted from each other in a lateral direction, the condition determination button (106) is clicked to determine the result of the focus reference value (step 93).

Figure 11:
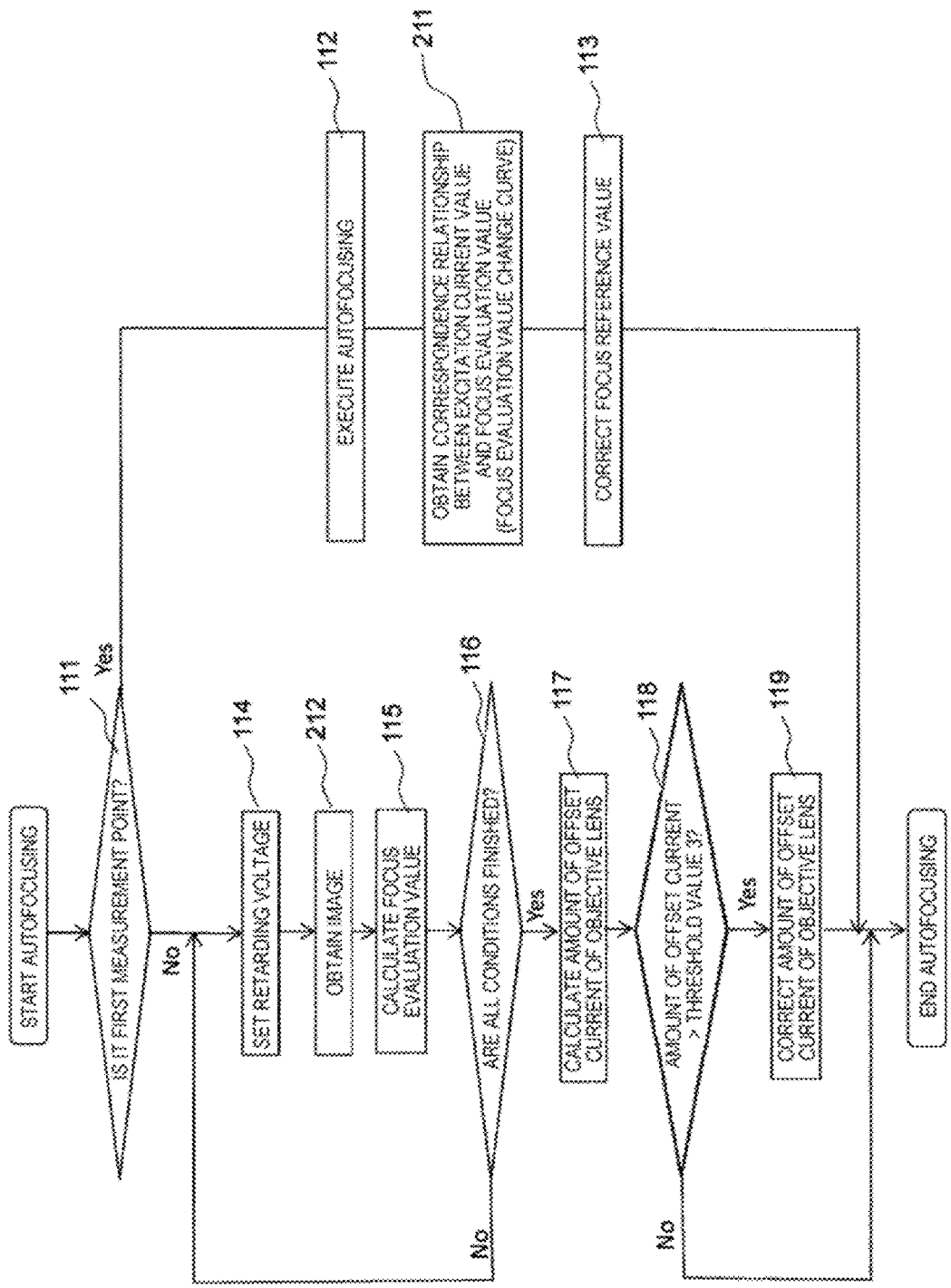
FIG. 11 is a diagram illustrating an autofocusing sequence in a recipe according to Example 3.

Next, a sequence of executing a recipe setting a focus evaluation condition will be described. Sequence of entire recipe is same as that of Example 1, and an autofocusing sequence included in a recipe will be described with reference to FIG. 11 below. It is determined whether it is the first measurement point (step 111). When it is the first measurement point, autofocusing is executed (step 112), a focus evaluation value is calculated (step 211), and focus reference values are calibrated such that the peak value is equal to the focus value calculated at the first measurement point with focused condition.

If a measurement point is the second measurement point or later, focus adjustment is executed by the following procedure based on the result obtained by the sequence of FIG. 9(B). First, the retarding voltage used for acquiring focus evaluation value 1 is set (step 114), an image is acquired (step 212), and focus evaluation values are calculated (step 115).
Next, the images are acquired to calculate focus evaluation value with the retarding voltages used for acquiring focus evaluation value 2 and focus evaluation value 3 respectively. The same processes, including the setting of the retarding voltage (step 114), image acquisition (step 212), and calculation of the focus evaluation values (step 115), are used to calculate focus evaluation values. Whether or not the series of processes are completed is determined (step 116). When all the series of processes are completed, the amount of offset current of the objective lens is calculated (step 117). A method of calculating the amount of offset current will be described with reference to FIGS. 12(A) and 12(B) below.

Figure 12A:
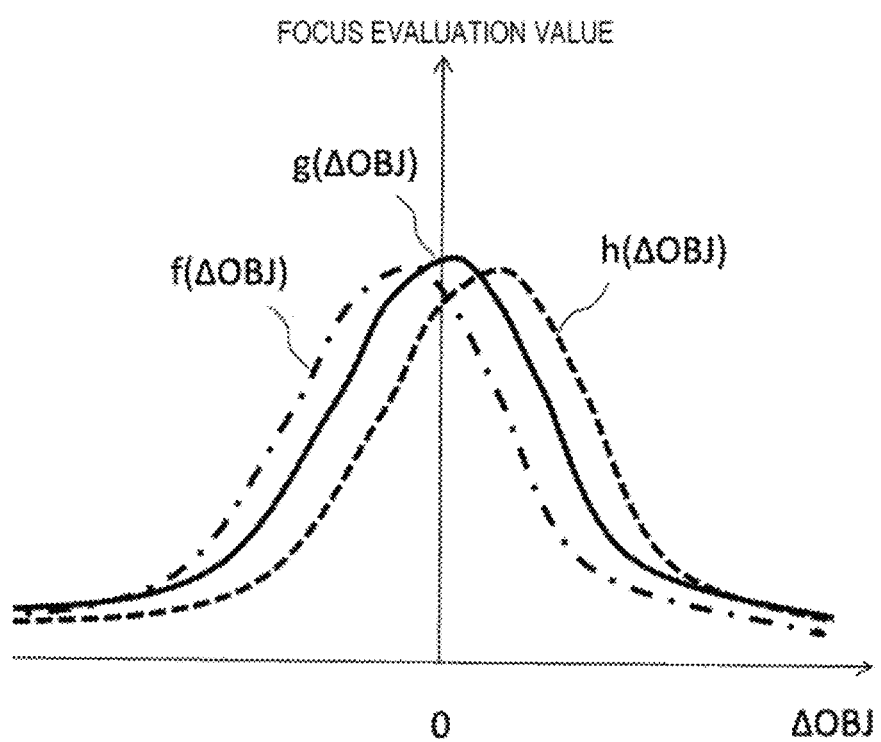
FIG. 12A is a diagram illustrating a focus evaluation value curve according to Example 3.

As illustrated in FIG. 12(A), a focus evaluation value change curve $f(\Delta OBJ)$ of the first focus evaluation value, a focus evaluation value change curve $g(\Delta OBJ)$ of the second focus evaluation value, and a focus evaluation value change curve $h(\Delta OBJ)$ of the third focus evaluation value are shifted in the horizontal axis direction with each other. Here, $\Delta OBJ$ is offset amount from the excitation current value (focusing current value) of the objective lens at focused position. And values a, b, and c are focus evaluation value 1, value 2, and value 3 those are calculated at the step 115a, respectively. The offset current $\Delta OBJ$ can be determined as a value such that the sum of squares of differences between the focus evaluation value change curve and the focus evaluation values calculated in step 115 is minimum. That is, the amount of offset current $\Delta OBJ$ value can be determined such that $Z(\Delta OBJ)$ calculated by the following equation is minimum.

$$Z(\Delta OBJ) = \{f(\Delta OBJ)-a\}^2 + \{g(\Delta OBJ)-b\}^2 + \{h(\Delta OBJ)-c\}^2 \quad \text{[Equation 1]}$$

The equation above is a representative example of a calculating formula when there are three focus evaluation values (focus evaluation value 1, focus evaluation value 2, and focus evaluation value 3). When there are n focus evaluation values, the amount of offset current $\Delta OBJ$ is determined such that the sum of squares of the n differences is minimum.

Figure 12B:
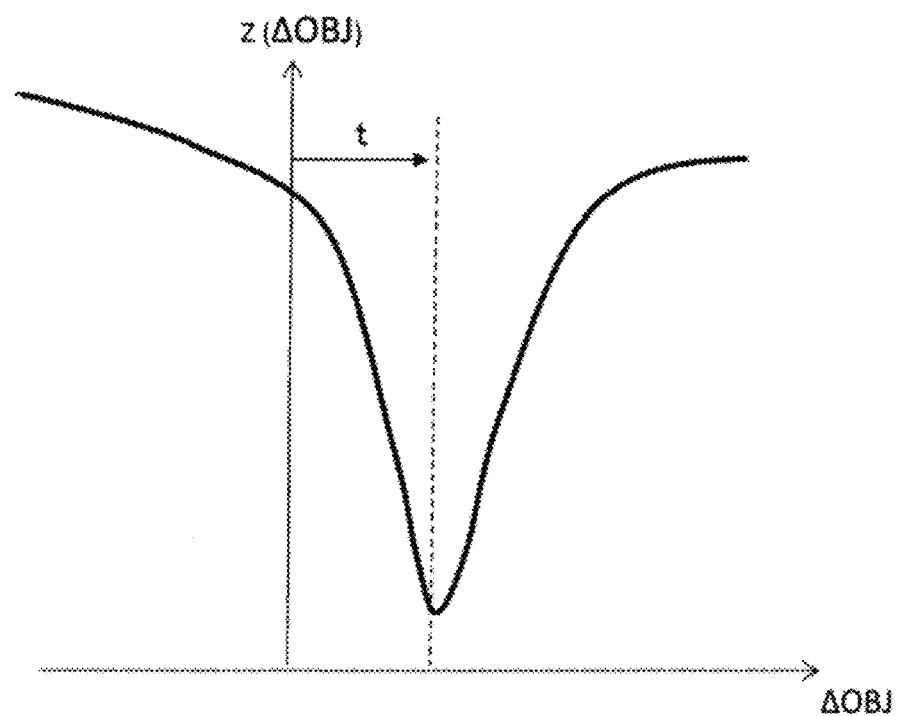
FIG. 12B is a diagram illustrating the focus evaluation value curve according to Example 3.

FIG. 12(B) illustrates a change of $Z(\Delta OBJ)$ when the amount of offset current of the objective lens; $\Delta OBJ$ is changed. The value of $Z(\Delta OBJ)$ is minimum when $\Delta OBJ=t$. In the step 118 of the autofocusing sequence illustrated in FIG. 11, it is determined whether or not the calculated amount of offset current is greater than the threshold value 3. The excitation current of the objective lens is corrected by the calculated amount of offset current (step 119). In this case, the threshold value 3 is set before recipe run such that merit of recipe execution speed improvement, in another word tool throughput improvement, is larger than that of image quality improvement given by correcting the amount of offset current, if an amount of offset current is less than the threshold value 3.

According to Example 3, an appropriate excitation current may be supplied or an excitation current may be corrected to focus on a desired measurement point by an objective lens without performing a process requiring a large amount of time to calculate the focus evaluation value by changing excitation current value of the objective lens many times whenever autofocusing is performed. As a result, it is unnecessary to calculate the focus evaluation value by changing the excitation current value of the objective lens many times for autofocusing, and thus, an autofocusing time can be decreased to improve throughput of the tool.

According to Example 3, an offset current of the objective lens may be obtained by using n focus evaluation values, thereby achieving an effect of improving the accuracy of correction of the amount of current.

Example 4

In Example 4, a method of calculating a fitting function representing the relationship between an excitation current value of an objective lens and a focus evaluation value for each different pattern, and determining an amount of offset current of the objective lens as a point where total error between focus evaluation values measured with a plurality of retarding conditions at each measurement point and values acquired from a fitting function becomes the minimum will be described below.

Figure 13A:
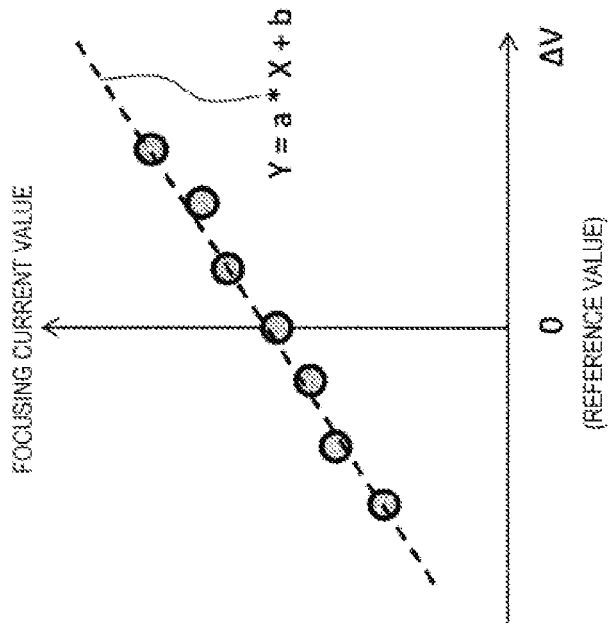
FIGS. 13A and 13B are diagrams illustrating a method of calculating the relationship between a retarding voltage offset and a focusing current value according to Example 4.
Figure 13B:
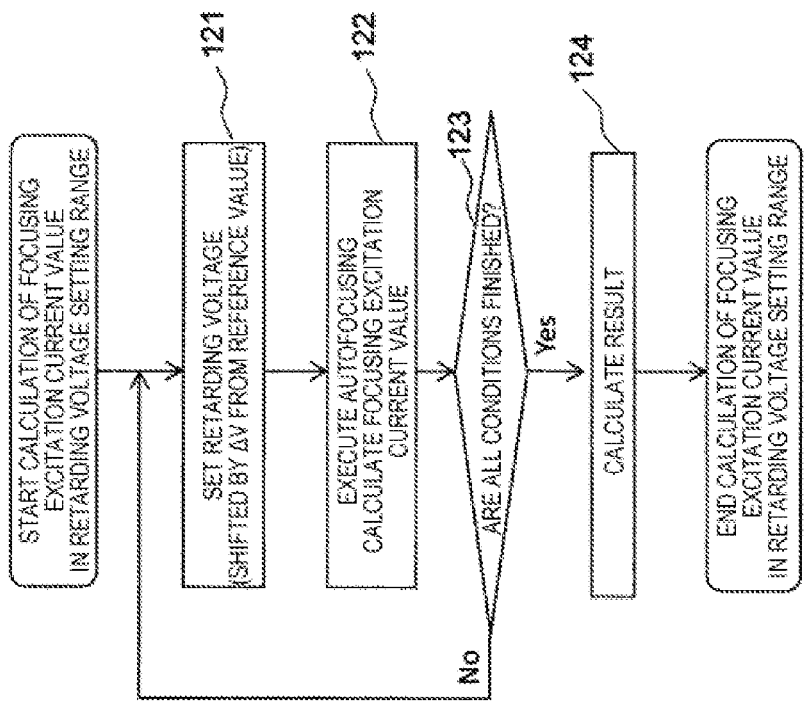

First, as a preparation, a relationship between an offset amount ($\Delta V$) from a reference retarding voltage and a focusing current value is calculated in advance. The sequence will be described with reference to FIG. 13(A) below. A retarding voltage is shifted by $\Delta V$ from a reference value (step 121), and autofocusing is executed to get an excitation current value (focusing current value) of the objective lens which is in focus (step 122). It is determined whether calculations of focusing current values under predetermined retarding voltage conditions have been completed (step 123). If there is a remaining condition, the steps 121 and 122 are executed for the condition. If all conditions have been finished, a relationship between offset amounts ($\Delta V$) from the reference retarding voltage and focusing current values is calculated as illustrated in FIG. 13(B) (step 124). Here, the coefficient "a" representing the amount of change of the focusing current value when the retarding voltage is changed by 1 V is important.

In Example 4, the coefficient "a" is calculated by changing the excitation current of the objective lens by autofocusing while shifting a retarding voltage offset amount ($\Delta V$) from the reference value. Alternatively, the coefficient "a"

can be calculated by changing a retarding voltage while shifting excitation currents of the objective lens from the focusing current value.

Figure 15:
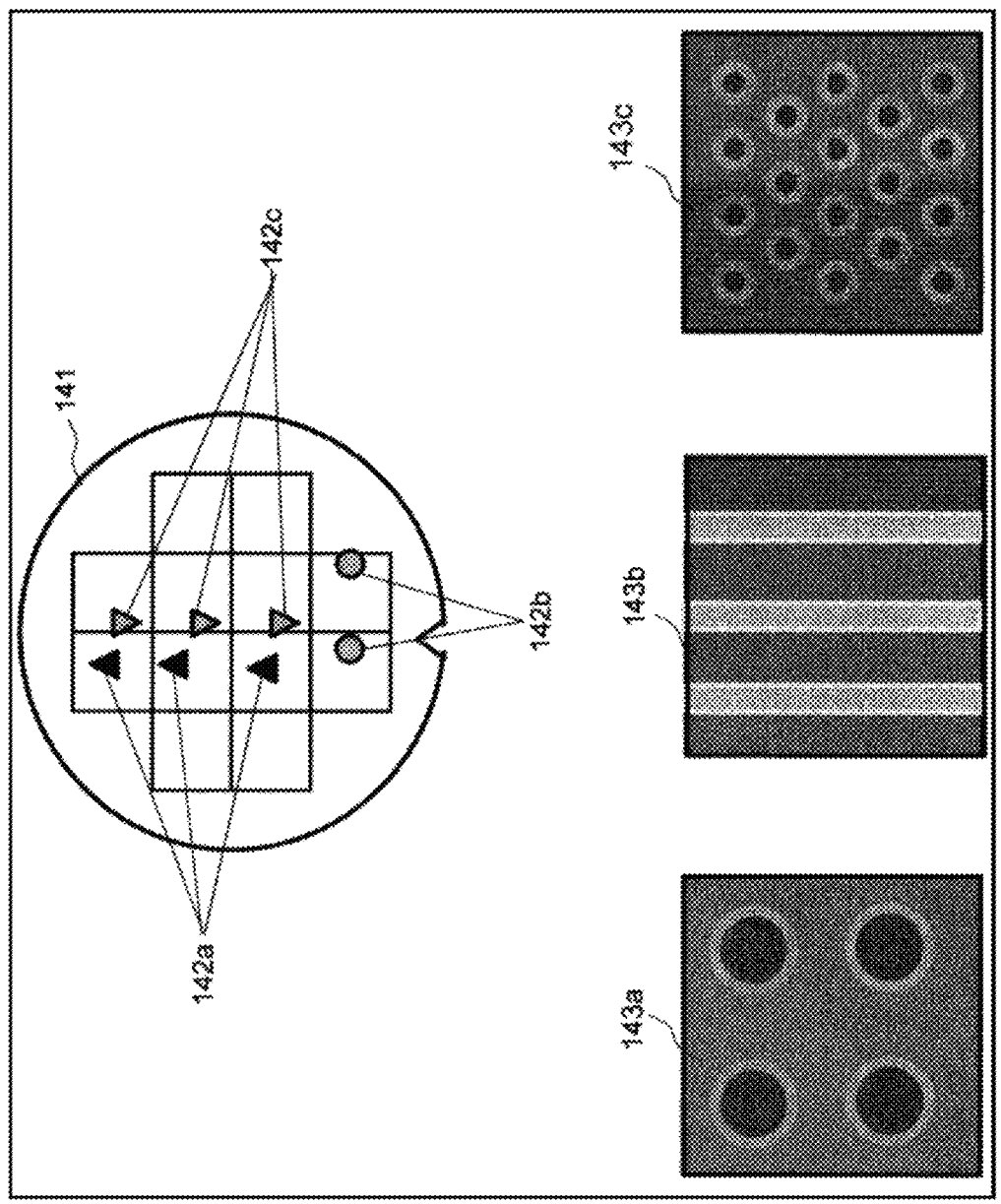
FIG. 15 is a diagram illustrating measurement point groups according to Example 4.
Figure 16:
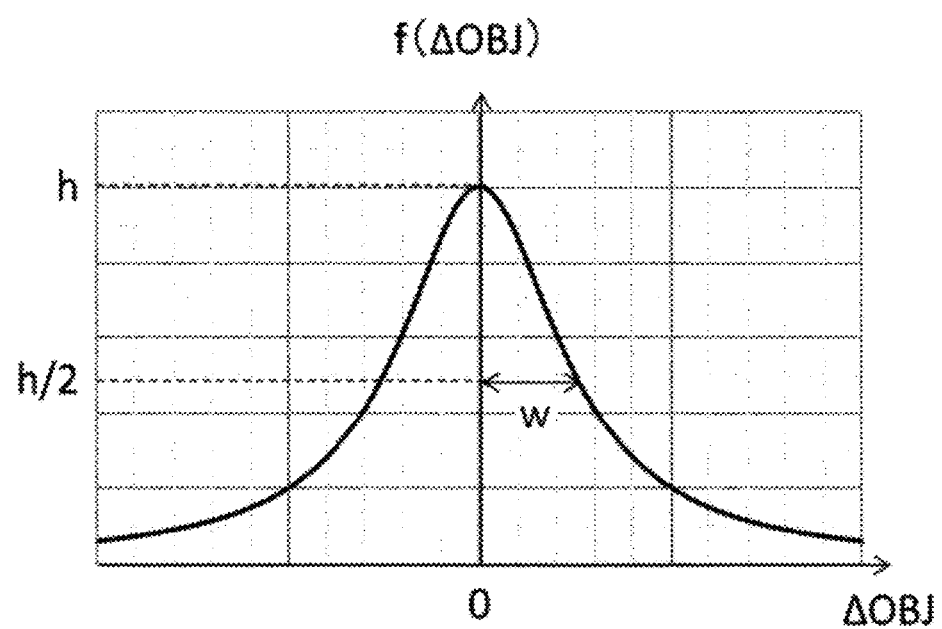
FIG. 16 is a diagram illustrating a fitting function according to Example 4.

Next, autofocusing sequence in recipe execution process will be described with reference to FIG. 14 below. It is determined whether it is the first measurement point of the group (step 131). If it is the first measurement point of the group, autofocusing is executed (step 132), and a fitting function is calculated (step 133). Here, grouping of measurement points will be explained with reference to FIG. 15. A plurality of measurement points (142) on the semiconductor wafer (141) are classified into the three groups according to characteristics of patterns. The first measurement point group (142a) consists of a set of circular patterns (143a), and the second measurement point group (143b) consists of a set of vertical line patterns. The third measurement point group corresponding to the measurement positions (142c) consists of a set of dense circular patterns (143c). The first measurement point group (142a), the second measurement point group (142b), and the third measurement point group (142c) are groups of patterns having different characteristics. A reason why a fitting function is calculated for each group is that fitting function varies depending on size and shape of a pattern. Next, a fitting function format will be explained with reference to FIG. 16 below. In Example 4, the following function is used as the fitting function.

$f(\Delta OBJ)=h/\{1+(\Delta OBJ/w)^2\}$

Here, h: focus evaluation value when the current value of the objective lens is on focus condition, and w: ½ of half width.

If a measurement point is after the second measurement point of each group or later, retarding voltage is changed by the predetermined offset amount (step 134), an image is acquired (step 213), and a focus evaluation value is calculated (step 135). It is judged whether focus evaluation values have calculated for the predetermined retarding voltage conditions or not (step 136). If all the calculations have finished, the amount of offset current of the objective lens is calculated (step 137).

Figure 17A:
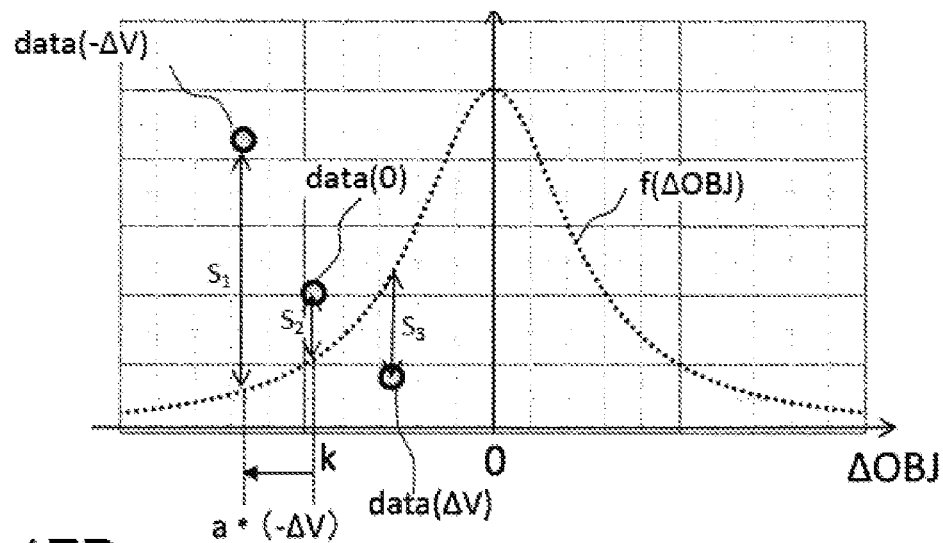
FIGS. 17A and 17B are diagrams illustrating a method of calculating the amount of offset current of an objective lens according to Example 4.

Hereinafter, a method of calculating the amount of offset current ΔOBJ from a focusing current value of the objective lens will be described with reference to FIG. 17. The amount of offset current ΔOBJ is determined by identifying the position where all focus evaluation values are substantially coincident with the fitting function "f(ΔOBJ)". First, a sequence of calculating the index value "G(ΔOBJ)" which indicates error amount between the fitting function "f(ΔOBJ)" and three focus evaluation values "data(−ΔV), data(0), and data (ΔV)" will be described with reference to FIG. 17(A). Here, the data(−ΔV), the data(0) and the data (ΔV) represent the focus evaluation values when offset amounts from the reference retarding voltage are −ΔV, 0, and ΔV. FIG. 17(A) illustrates the case in which ΔOBJ is "k". If the offset amount of the focusing current value of the objective lens when the retarding voltage is changed by 1 V is "a", the offset amount of the focusing current value of the objective lens corresponding to the ±ΔV retarding voltage shift is described as "a*(±ΔV)".

Therefore, G(k) is calculated by the following equation $G(k)=S_1^2+S_2^2+S_3^2$ $S_1=data(-\Delta V)-f(k-a*\Delta V)$ $S_2=data(0)-f(k)$ $S_3=data(\Delta V)-f(k+a*\Delta V)$ Here, a: the amount of offset of the objective lens focusing current value when retarding voltage is changed by 1 V.

Figure 17B:
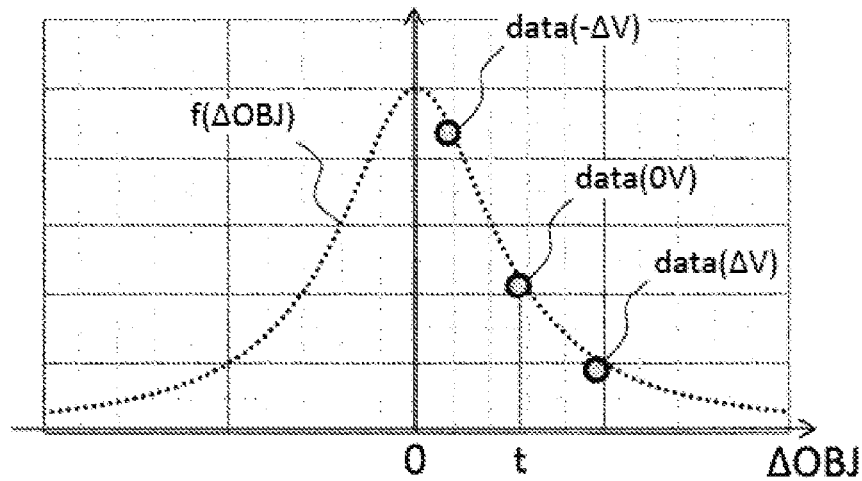

The G(ΔOBJ) is minimum when all of "data(−ΔV), data (0), and data(ΔV)" are coincident with the fitting function, as illustrated in FIG. 17(B). In this case, the calculated ΔOBJ is "t".

For convenience of explanation, the case in which the number of retarding-voltage offset conditions is three has been described in FIG. 17. However, G(ΔOBJ) representing the sum of squares of errors from the fitting function is generally expressed by the following equation.

$$G(\Delta OBJ) = \sum_{\Delta V=\Delta V_{start}}^{\Delta V_{end}} [data(\Delta V) - f(\Delta OBJ + a*\Delta V)]^2 \quad \text{[Equation 2]}$$

Here, data(ΔV): the focus evaluation value with respect to a retarding-voltage offset amount ΔV, and a: the amount of focusing current offset of the objective lens when the retarding voltage is changed by 1 V G(ΔOBJ) represents, for example, the shape illustrated in FIG. 18, wherein the graph of FIG. 18 shows the case in which the amount of offset current from the focusing current value of the objective lens is "t". As described above, the amount of offset current from the focusing current value can be calculated to be ΔOBJ when G(ΔOBJ) is the minimum.

Figure 14:
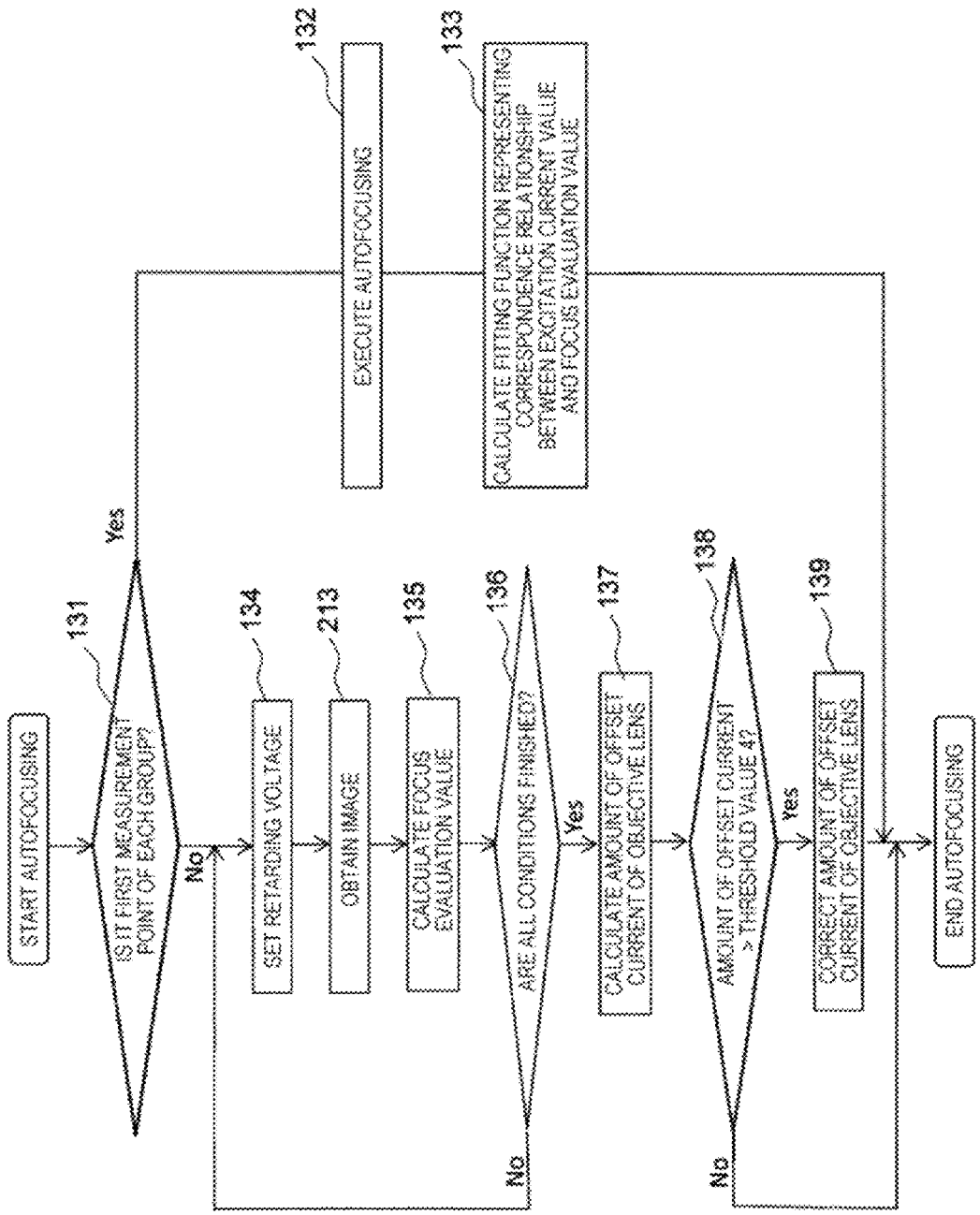
FIG. 14 is a diagram illustrating an autofocusing sequence in a recipe according to Example 4.

In the sequence illustrated in FIG. 14, it is determined whether or not the amount of offset current from the focusing current value of the objective lens is equal to or less than the threshold value 3 (step 138). If the amount of offset current is equal to or less than the threshold value 3, the objective lens current is not corrected. On the other hand, if the amount of offset current from the focusing current value of the objective lens is larger than the threshold value 4, the excitation current is corrected by the amount of offset current (step 139). In this case, the threshold value 4 is set by a user via GUI such that a merit of throughput improvement of an executing recipe by skipping objective lens current correction process is larger than that of image quality improvement by correcting lens current, if amount of offset current is smaller than the threshold.

According to the Example 4, an excitation current of objective lens can be appropriately supplied or corrected to focus on desired measurement points without performing a process requiring a large amount of time to calculate focus evaluation values by changing excitation current value of the objective lens many times for autofocusing. Since it is unnecessary to calculate focus evaluation values by changing excitation current value of the objective lens many times for autofocusing, autofocusing time can be shortened. As a result throughput of the tool can be improved.

The present invention is applicable to a recipe having patterns of different features as measurement points, according to the Example 4. By using a fitting function, effects of recipe simplification and correction accuracy improvement can be obtained.

Example 5

Figure 19:
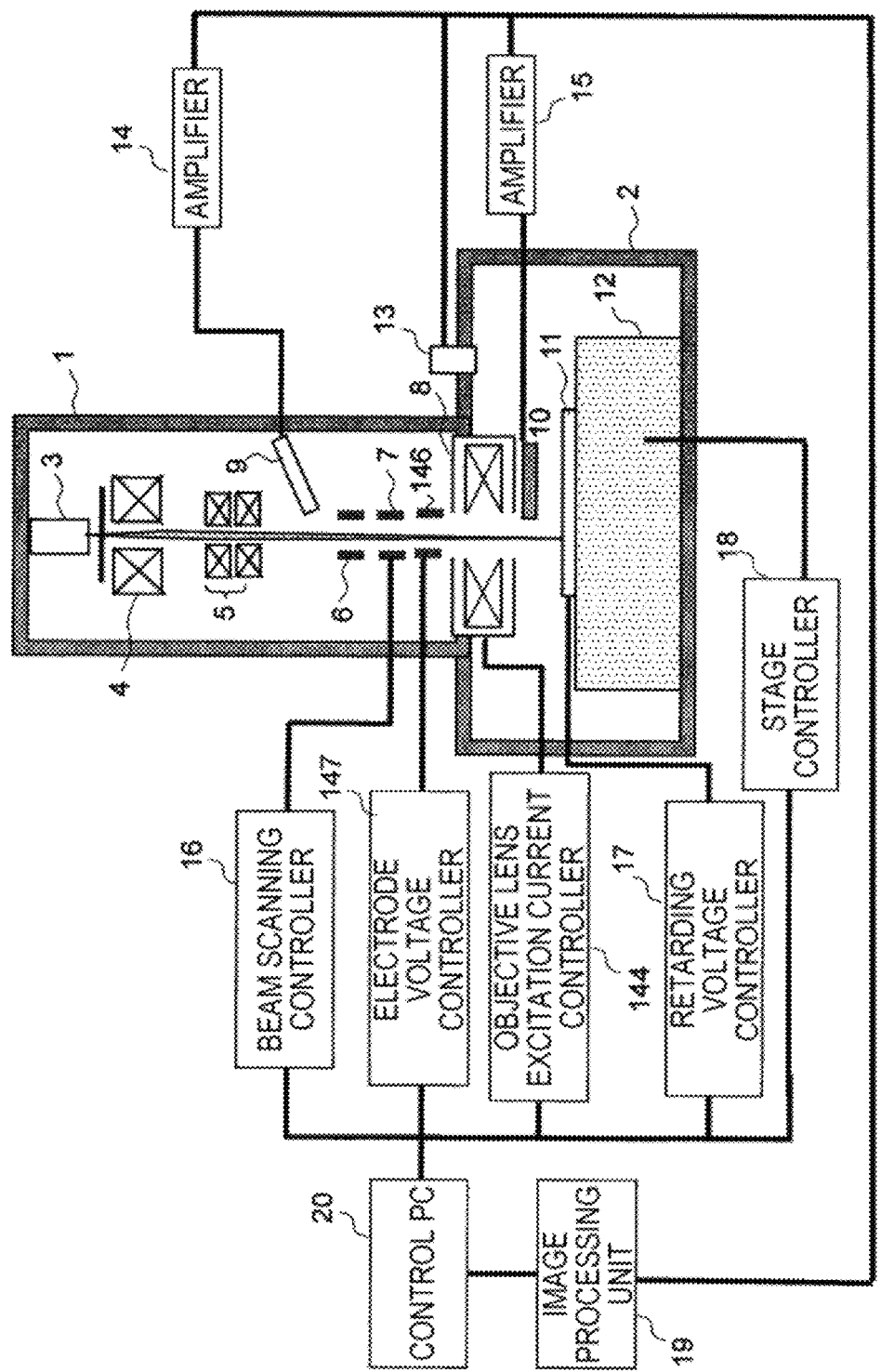
FIG. 19 is a schematic block diagram of a device according to Example 5.

In the configuration of the tool according to the Example 5, the electrode voltage controller 147 for applying a voltage to the electrode 146 inside the column 1 is provided (FIG. 19). In the Examples 1 to 4 described above, the excitation currents supplied to the objective lens are corrected according to changes of focus evaluation values when the voltage to be applied to the samples (the retarding voltage) are changed have been described. In contrast, in the Example 5, the focus evaluation value of the electron beam when the voltage to be applied to the electrode inside the column of the scanning electron microscope is changed instead of the voltage (the retarding voltage) applied to the sample is evaluated. Whether to increase or decrease the excitation current of the objective lens is determined according to the increase or decrease of the focus evaluation value, and the excitation current is supplied based on the result of the determination. Alternatively, a correspondence relationship consisting of a plurality of focus evaluation values corresponding to a plurality of excitation currents from a current source is obtained, the amount of offset current from the focusing position of the objective lens is obtained based on the correspondence relationship and the previous determination result, and the excitation current is corrected based on the amount of offset current. Similarly, with this constitution, it is possible to solve the conventional problem described above in the present invention can be solved. As a result, the throughput of the tool can be improved by decreasing an autofocusing time.

REFERENCE SIGNS LIST

1: column
2: sample chamber
3: electron gun
4: condenser lens
5: aligner
6: E×B filter
7: deflector
8: objective lens
9: secondary electron detector
10: backscattered electron detector
11: wafer
12: XY stage
13: optical microscope
14, 15: amplifier
16: beam scanning controller
17: retarding voltage controller
18: stage controller
19: image processing board
20: control PC
21 to 27: each step in recipe according to Example 1
31 to 48, 58, 59, 145: each step of autofocusing in recipe according to Example 1
56, 57: SEM image for calculation of focus evaluation value
51 to 53: focus evaluation value change curve
61 to 64, 201 to 206: each step of focus evaluation condition setting according to Example 2
71 to 77: parts of focus evaluation condition setting GUI according to Example 2
81 to 85: each step of autofocusing in recipe according to Example 2
91 to 93: each step of focus evaluation condition setting according to Example 3
101 to 106: parts of focus evaluation condition setting GUI according to Example 3
111 to 119: each step of autofocusing according to Example 3
121 to 124: each step of calculating focusing excitation current value in retarding voltage setting range according to Example 4
131 to 139, 213: each step of autofocusing in recipe according to Example 4
141: wafer
142: measurement point
143: pattern shape
144: objective lens excitation current controller
146: electrode
147: electrode voltage controller

The invention claimed is:

1. A scanning electron microscope comprising:
an objective lens configured to converge an electron beam emitted from an electron source;
a current source configured to supply an excitation current to the objective lens;
a negative-voltage applying power supply configured to form a decelerating electric field of the electron beam on a sample;
a detector configured to detect charged particles generated when the electron beam is emitted to the sample; and
a control device configured to calculate a focus evaluation value from an image formed according to an output of the detector,
wherein the control device is configured to determine a correspondence relationship between a plurality of predetermined focus evaluation values and a plurality of predetermined excitation currents from the current source and a focusing current value when an applied voltage from the negative-voltage applying power supply is a constant voltage, in advance at a first measurement point on the sample,
wherein for a second measurement point that is different from the first measurement point,
the control device is configured to calculate the focus evaluation value before and after the applied voltage is changed when the constant voltage applied from the negative-voltage applying power supply is changed by a predetermined voltage, in a state where the excitation current of the current source is set to the focusing current value at the first measurement point;
the control device is configured to determine whether to increase or decrease the excitation current to be supplied to the objective lens at the second measurement point from the focusing current value at the first measurement point according to an increase or a decrease of the focus evaluation value at the second measurement point before and after the applied voltage is changed; and
the control device is configured to correct the excitation current to be supplied to the objective lens based on a result of the determination while the applied voltage from the negative-voltage applying power supply is kept at the constant voltage before change.

2. The scanning electron microscope according to claim 1, wherein
the control device is configured to calculate an amount of offset current from the focusing current value of the objective lens at the second measurement point based on the correspondence relationship and the focus evaluation value at the second measurement point at the constant voltage before the applied voltage is changed, and determines whether to increase or decrease the excitation current by the amount of offset current from the focusing current value at the first measurement point.

3. The scanning electron microscope according to claim 1, wherein
the control device is configured to measure a target pattern formed on the sample based on a condition registered in a recipe.

4. The scanning electron microscope according to claim 3, wherein
the control device includes a storage unit, and
the correspondence relationship at one measurement point on the sample is calculated at a first measurement point registered in the recipe, and stored in the storage unit.

5. The scanning electron microscope according to claim 1, wherein
the control device does not correct the excitation current when the focus evaluation value at the second measurement point at the constant voltage before the applied voltage is changed is larger than a first threshold value.

6. The scanning electron microscope according to claim 5, wherein
the control device is configured to correct the excitation current when the focus evaluation value at the second measurement point at the constant voltage before the applied voltage is changed is equal to or less than the first threshold value and is greater than a second threshold value.

7. The scanning electron microscope according to claim 3, wherein
the control device is configured to register the correspondence relationship in the recipe.

8. The scanning electron microscope according to claim 7, wherein
the control device includes an input unit configured to input an evaluation condition for calculating the correspondence relationship, and an output unit configured to output an image formed under the evaluation condition and the focus evaluation value calculated from the image.

9. A scanning electron microscope comprising:
an objective lens configured to converge an electron beam emitted from an electron source;
a current source configured to supply an excitation current to the objective lens;
a voltage applying power supply configured to apply a voltage to an electrode of a column;
a detector configured to detect charged particles generated when the electron beam is emitted to a sample; and
a control device configured to evaluate focus of the electron beam in an image formed according to an output of the detector,
wherein the control device is configured to determine a correspondence relationship between a plurality of predetermined focus evaluation values corresponding to and a plurality of predetermined excitation currents from the current source and a focusing current value when an applied voltage from the voltage applying power supply is a constant voltage, in advance at a first measurement point on the sample,
wherein for a second measurement point that is different from the first measurement point,
the control device is configured to calculate the focus evaluation value before and after the applied voltage is changed when the constant voltage applied from the voltage applying power supply is changed by a predetermined voltage, in a state where the excitation current of the current source is set to the focusing current value at the first measurement point;
the control device is configured to determine whether to increase or decrease the excitation current to be supplied to the objective lens at the second measurement point from the focusing current value at the first measurement point according to an increase or a decrease of the focus evaluation value at the second measurement point before and after the applied voltage is changed; and
the control device is configured to correct the excitation current to be supplied to the objective lens based on a result of the determination while the applied voltage from the voltage applying power supply is kept at the constant voltage before change.

* * * * *